United States Patent
Kochi et al.

(10) Patent No.: US 6,852,974 B2
(45) Date of Patent: Feb. 8, 2005

(54) ELECTRON BEAM DEVICE AND METHOD FOR STEREOSCOPIC MEASUREMENTS

(75) Inventors: Nobuo Kochi, Tokyo (JP); Hirotami Koike, Tokyo (JP)

(73) Assignee: Topcon Corporation, Tokyo (JP)

(*) Notice: Subject to any disclaimer, the term of this patent is extended or adjusted under 35 U.S.C. 154(b) by 22 days.

(21) Appl. No.: 10/086,625

(22) Filed: Mar. 4, 2002

(65) Prior Publication Data

US 2002/0179812 A1 Dec. 5, 2002

(30) Foreign Application Priority Data

| Mar. 6, 2001 | (JP) | ................................... 2001-062686 |
| Mar. 6, 2001 | (JP) | ................................... 2001-062687 |
| Mar. 6, 2001 | (JP) | ................................... 2001-062688 |

(51) Int. Cl.$^7$ ................................................ G01N 23/00
(52) U.S. Cl. ..................................... 250/311; 250/307
(58) Field of Search ................................ 250/306, 307, 250/310, 311, 442.11, 397, 396 R

(56) References Cited

U.S. PATENT DOCUMENTS

| 2,436,676 A | * | 2/1948 | Runge et al. ............... 250/311 |
| 2,617,041 A | * | 11/1952 | Fleming ..................... 250/307 |
| 3,585,382 A | * | 6/1971 | Suganuma ................... 250/310 |
| 4,039,829 A | * | 8/1977 | Kato et al. .................. 250/306 |
| 4,233,510 A | * | 11/1980 | Sato ........................... 250/310 |
| 4,725,730 A | * | 2/1988 | Kato et al. .................. 250/307 |
| 4,755,047 A | * | 7/1988 | Kato et al. .................. 250/310 |
| 4,766,311 A | * | 8/1988 | Seiler et al. ............... 250/252.1 |
| 4,943,722 A | * | 7/1990 | Breton et al. ............... 250/310 |
| 5,001,344 A | * | 3/1991 | Kato et al. .................. 250/307 |
| 5,029,250 A | * | 7/1991 | Komatsu et al. ............ 250/310 |
| 5,777,327 A | * | 7/1998 | Mizuno ....................... 250/310 |
| 6,661,507 B2 | * | 12/2003 | Yoda et al. ............... 356/237.2 |

OTHER PUBLICATIONS

"Medical and Biologcal Electron Microscopy," Japanese Society of Electron Microscopy, pp. 278–299, Jan. 20, 1982.

* cited by examiner

Primary Examiner—Nikita Wells
Assistant Examiner—James P. Hughes
(74) Attorney, Agent, or Firm—Foley & Lardner LLP

(57) ABSTRACT

An electron beam device according to the present invention is made up of an electron beam source for emitting an electron beam, an electron optical system for irradiating the electron beam onto a specimen, a specimen holder for holding the specimen, a specimen tilting section for producing relative tilt angles between the specimen holder and the electron beam, an electron beam detecting section for detecting electron beam emitted from the specimen, and a data correcting section for correcting the three-dimensional detection data to have specified relationship under the condition of a relative tilt angle between the specimen holder and the electron beam.

19 Claims, 12 Drawing Sheets

0 degree 10 degrees

Epipolar line

FIG.12 (A)
Laplacean operator
| 0 | −1 | 0 |
|---|----|---|
| −1 | 5 | −1 |
| 0 | −1 | 0 |
FIG.12 (B)
Line detecting operator
| −1/2 | 1 | −1/2 |
|------|---|------|
| −1/2 | 1 | −1/2 |
| −1/2 | 1 | −1/2 |
FIG.13
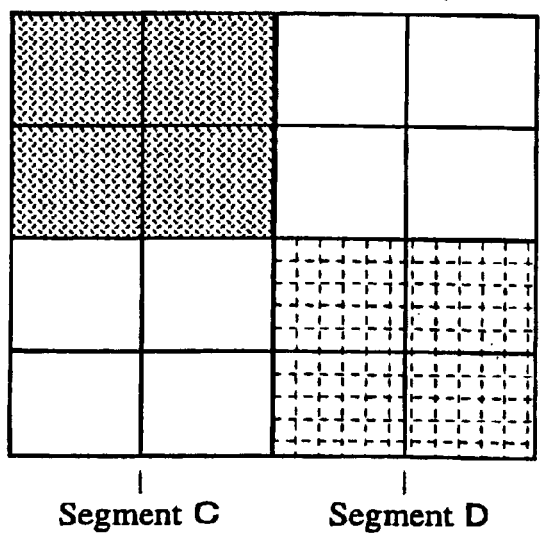
FIG.14
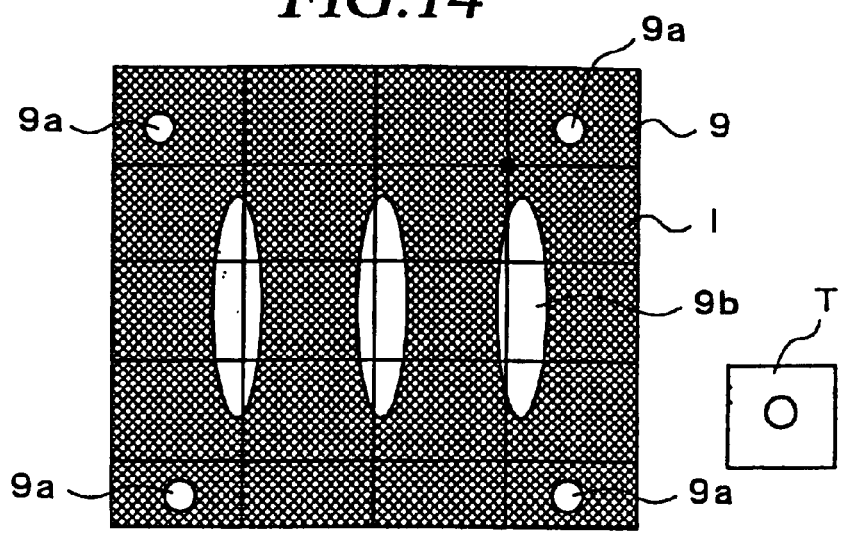

ELECTRON BEAM DEVICE AND METHOD FOR STEREOSCOPIC MEASUREMENTS

BACKGROUND OF THE INVENTION

1. Field of the Invention

This invention relates to an electron beam device, a data processor for the electron beam device, and a method of producing stereo data of the electron beam device, for converting images obtained with an electron microscope into images for stereovision and for finding shapes of specimens. This invention also relates to a reference template and the preparation thereof for use in obtaining parameters necessary for correcting deviation of three-dimensional images obtained with the electron microscope and necessary for correcting lens distortion.

2. Description of the Related Art

For three-dimensional viewing of a specimen with a transmission electron microscope (TEM), the specimen is tilted to obtain right and left transmission images at different tilt angles, and right and left images are used for stereovision. In the case of the stereovision with a scanning electron microscope (SEM), either the beam of electrons or the specimen is tilted to obtain right and left images reflected at different angles, and each of the images is viewed with one eye (Refer to Medical and Biological Electron Microscopy, pp. 278–299, 1982). The above methods, like in the stereovision with unaided eyes, provide images that suffice to observe general irregularities of the specimen.

On the other hand, in the case of performing three-dimensional observation by obtaining right and left images taken from different tilt angles to perform accurate measurement of a three-dimensional shape, very accurate angular control down to the order of a few seconds is required for the tilt angle of the specimen, and for the tilt angle of the beam of electrons to reduce the, effect of aberration in the electron lens system of the electron microscope. In conventional methods, however, there is a problem that the angular control is done generally in the order of a few degrees or a few minutes and therefore the control accuracy is insufficient for, performing accurate measurement of three-dimensional shapes by the stereovision of the right and left images.

SUMMARY OF THE INVENTION

This invention has been made to solve the above problems. The first object of this invention is to provide an electron beam device that makes it possible to appropriately process three-dimensional detection data obtained with an electron microscope, to view specimen images three-dimensionally with high accuracy, and to carry out measurement of three-dimensional shapes on the basis of the accurate three-dimensional viewing.

The second object of this invention is to provide a data processing device and a method of producing three-dimensional data for use with the above electron beam device that enable accurate stereovision and three-dimensional measurement of the specimen based on the accurate stereovision.

The third object of this invention is to provide a reference template having reference marks serving as reference points to create rectified images for performing three-dimensional shape measurement of specimens and for accurate three-dimensional viewing of specimens by appropriately processing three-dimensional data obtained with the electron microscope, and a method of preparing the reference template.

An electron beam device of this invention for accomplishing the above first object comprises for example as shown FIGS. 3, 15, and 16: an electron beam source 1 for emitting an electron beam 7, an electron optical system 2 for irradiating the electron beam 7 onto a specimen 9, a specimen holder 3 for holding the specimen 9, a specimen tilting section for producing a relative tilt between the specimen holder 3 and the electron beam 7, an electron beam detecting section 4 for detecting electron beams 7d emitted from the specimen 9, and a data correcting section 31 for correcting the three-dimensional detection data to have specified relationship when the relative tilt is produced between the specimen holder 3 and the electron beam 7.

Here, the specimen tilting section may be constituted with a holder tilt control section 5b to tilt the specimen 9 relative to the emitted electron beam 7 by controlling the tilt angle of the specimen holder 3, or it may be constituted with a beam tilt control section 5a to irradiate the emitted electron beam 7 aslant to the specimen 9 by controlling the electron optical system 2. The electron beam detecting section 4 of the scanning electron microscope is preferably constituted to detect secondary electrons emitted from the specimen 9.

Detecting data three-dimensionally means that the electron beam 7 is irradiated to the specimen holder 3 at different, first and second angles and first and second data of the specimen 9 are detected with the electron beam detecting section 4. The different two incident angles of the electron beam 7 to the specimen holder 3 are produced when the beam tilt control section 5a is used as shown in FIG. 3. That is, the electron beam 7R is irradiated at the first tilt angle and the electron beam 7L is irradiated at the second tilt angle. When the holder tilt control section 5b is used as shown in FIGS. 15 and 16, the specimen holder 3 is tilted to the first tilt angle as indicated with the letter R and to the second tilt angle as indicated with the letter L.

"Correcting the three-dimensional detection data to have specified relationship" with the data correcting section 31 means to orientate the data of two images so that deviation can be corrected. "Rectified" means to correct the distortion of image data detected at different tilt angles and to arrange the data in a unified scale. "Orientating images" means to enable stereovision by reversely projecting data of two sheets of pictures under the same condition as when the electron beam 7 is irradiated to the specimen 9 and to arrange the data in a state for use in three-dimensional measurement or for forming three-dimensional images of the specimen 9, in conformity with the data processing in the aero-triangulation.

Preferably the electron beam device of this invention further comprises at least one of a shape measuring section 32 for measuring the shape of the specimen 9 on the basis of the data corrected with the data correcting section 31 and a three-dimensional image observing section 33 for creating a three-dimensional image of the specimen 9 on the basis of the data corrected with the data correcting section 31.

A preferable constitution for easily correcting the three-dimensional detection data using reference marks provided on the specimen 9 is that the specimen 9 is provided with reference marks serving as reference positions, and the data correcting section 31 uses the reference marks to correct the three-dimensional detection data into rectified data. The reference marks may be formed by irradiating the electron beam 7 to the specimen 9. Alternatively, feature points of a pattern or the like already present on the specimen 9 may be used as reference marks.

A preferable constitution for easily rectification using a reference template is that the data correcting section 31 comprises a rectifying parameter acquiring means 31a for acquiring parameters for rectification at relative tilt angles between the specimen holder 3 and the incident electron beam 7, and an image data rectifying means 31b for correcting the detected three-dimensional data of the specimen 9 to produce rectified data, using the acquired rectifying parameters. The image data rectifying means 31b corrects the detected three-dimensional data of the specimen 9 into rectified data by the use of the rectifying parameters acquired with the rectifying parameter acquiring means 31a. Therefore, there is no need of preparing reference marks on the specimen 9, resulting in a high measurement efficiency.

The data processing device for the electron beam device for accomplishing the second object of this invention is for example as shown in FIGS. 3, 15, and 16 a data processing device 30 connected to the electron beam device 10 and is provided with the data correcting section 31 that receives three-dimensional data detected under the conditions of relative tilt angles between the specimen holder 3 and the incident electron beam 7 and corrects the received data to provide specified relationship. Here, the electron beam device 10 comprises the electron beam source 1 for emitting the electron beam 7, the electron optical system 2 for irradiating the electron beam 7 onto the specimen 9, the specimen holder 3 for holding the specimen 9, the specimen tilting section for producing a relative tilt between the specimen holder 3 and the electron beam 7, and the electron beam detecting section 4 for detecting electron beams 7d emitted from the specimen 9.

Preferably the data processing device for the electron beam device of this invention further comprises at least one of a shape measuring section 32 for measuring the shape of the specimen 9 on the basis of the data corrected with the data correcting section 31 and a three-dimensional image observing section 33 for creating a three-dimensional image of the specimen 9 on the basis of the data corrected with the data correcting section 31.

A method of producing three-dimensional data with the electron beam device for accomplishing the second object of this invention uses for example an arrangement as shown in FIG. 11 in which the reference marks serving as reference points are prepared on the specimen 9 (S311 and S314) and comprises the steps of detecting first detection data with the electron beam detecting section 4 under the condition of a first relative tilt angle between the specimen holder 3 and the incident electron beam 7 (S316), detecting second detection data with the electron beam detecting section 4 under the condition of a second relative tilt angle between the specimen holder 3 and the incident electron beam 7 (S316), and correcting the first and second detection data using the reference marks to produce rectified data (S322 and S326).

A method of producing three-dimensional data with the electron beam device for accomplishing the second object of this invention comprises for example as shown in FIG. 6 the steps of inserting in place of the specimen 9 a reference template 40 having on it reference marks serving as reference points onto the specimen holder 3 (S204), detecting first and second detection data for the reference template 40 under conditions of first and second relative tilt angles between the specimen holder 3 and the incident electron beam 7 (S206), and using the reference marks to acquire rectifying parameters at the relative tilt angles between the specimen holder 3 and the incident electron beam 7 (S208 and S210).

Next, as shown in FIG. 10, the specimen 9 is inserted onto the specimen holder 3 (S252), first and second detection data for the specimen 9 are detected under conditions of first and second relative tilt angles between the specimen holder 3 and the incident electron beam 7 (S254), and the first and second detection data of the specimen 9 are corrected using the acquired rectifying parameters to produce rectified data (S258 and S260).

A data processing device 20 for the electron beam device for accomplishing the second object of this invention is connected for example as shown in FIGS. 3, 15, and 16 to the electron beam device 10, and comprises a measurement condition judging section 25 for receiving measurement conditions in the electron beam device 10 and a shape measuring section 32 for receiving data detected with the electron beam detecting section 4 at different tilt angles under conditions of plural relative tilt angles between the specimen holder 3 and the incident electron beam 7 and for measuring three-dimensionally the shape of the specimen 9 on the basis of the measurement conditions determined with the measurement condition judging section 25.

Preferably the measurement condition judging section 25 is constituted to judge the measurement conditions using information on at least one of the type of the electron beam device 10 and the magnification of the electron optical system 2, so that the manner of calculating the correction of the data detected at different tilt angles is chosen appropriately. Different types of the electron beam device 10 are the transmission type electron microscope and the scanning type electron microscope. The magnification of the electron optical system 2 is divided into low and high magnifications, and is used as a factor of choosing either central or parallel projection for the manner of calculation for correcting the data detected at different tilt angles. The magnification of the electron optical system 2 is determined using a magnification setting signal of a magnification changing section 6 provided in the electron beam device 10.

To measure three-dimensionally the shape of the specimen 9 using the rectified data obtained by correcting the data detected at different tilt angles using reference marks formed on the specimen 9, a preferable constitution is that the specimen 9 has the reference marks serving as reference positions, and the shape measuring section 32 measures three-dimensionally the shape of the specimen 9 on the basis of reference mark data contained in the data detected at different tilt angles in the state of differences in distortion and in scale due to the tilt contained in the data detected at different tile angles corrected. The reference marks may be formed by irradiating the electron beam 7 onto the specimen 9. Alternatively, feature points of a pattern or the like already present on the specimen 9 may be used as reference marks.

Preferably the data processing device 20 is constituted to comprise a rectifying parameter acquiring means 31a for correcting differences in distortion and in scale due to the tilt contained in the data detected at different tilt angles between the specimen holder 3 and the incident electron beam 7 using the reference marks of the reference template, an image data rectifying means 31b for correcting differences in distortion and in scale due to the tilt contained in the data detected at different tilt angles between the specimen 9 using the acquired rectifying parameters, and a shape measuring section 32 for measuring three-dimensionally the shape of the specimen 9 using the data detected at different tilt angles and corrected with the image data rectifying means. In that way, the rectifying parameters may be acquired using the reference template on which the reference marks are formed without the need of forming reference marks on the specimen 9 or extracting feature points, so that the shape of the specimen 9 is measured in three dimensions accurately and efficiently.

Preferably the data processing device for the electron beam device of this invention is further constituted that: the reference marks on the reference template are provided in relation to at least two heights, the rectifying parameter acquiring means 31a further acquires a lens distortion correcting parameter for correcting the lens distortion of the electron optical system 2, and the image data rectifying means 31b corrects the lens distortion contained in the data detected at different tilt angles using the lens distortion correcting parameter. In that way, the shape measuring section 32 can measure three-dimensionally the accurate shape of the specimen 9 also with the lens distortion corrected.

A method of performing three-dimensional measurement with the electron beam device for accomplishing the second object of this invention uses for example an arrangement as shown in FIG. 11 in which the reference marks serving as reference points are formed on the specimen 9 (S311, S314) and comprises the steps of detecting first data with the electron beam detecting section 4 under the condition of a first relative tilt angle between the specimen holder 3 and the incident electron beam 7 (S316), detecting second data with the electron beam detecting section 4 under the condition of a second relative tilt angle between the specimen holder 3 and the incident electron beam 7 (S316), correcting the first and second detection data using the reference marks to produce rectified data (S322, S326), and measuring three-dimensionally the shape of the specimen 9 (S330).

A method of producing three-dimensional data with the electron beam device for accomplishing the second object of this invention comprises for example as shown in FIG. 6 the steps of inserting instead of the specimen 9 a reference template 40 formed with reference marks serving as reference points into the specimen holder 3 (S204), detecting first and second detection data for the reference template 40 under conditions of first and second relative tilt angles between the specimen holder 3 and the incident electron beam 7 (S206), and using the reference marks to acquire rectifying parameters for correcting differences in distortion and in scale due to differences in the first and second relative tilt angles contained in the first and second detection data (S208 and S210).

The method further comprises as shown in FIG. 10 the steps of inserting the specimen 9 onto the specimen holder 3 (S252), detecting first and second detection for the specimen 9 using the electron beam detecting section 4 under conditions of first and second relative tilt angles between the specimen holder 3 and the incident electron beam 7 (S254), using the acquired rectifying parameters to correct the differences in distortion and in scale due to differences in the first and second relative tilt angles of the specimen 9 (S258 and S260), and measuring three-dimensionally the shape of the specimen 9 (S264).

A method of preparing the reference template for accomplishing the third object of this invention comprises for example as shown in FIG. 5 the steps of attaching to the specimen holder 3 a reference template substrate 40b to be a reference template (S100), moving and irradiating the electron beam 7 to the positions where reference marks are to be created on the reference template substrate 40b (S104, S106 and S108), and creating the reference marks on the reference template substrate 40b (S110).

Preferably the reference marks serving as reference points are at least three points of contamination or defects to produce rectified images. If preparation of the reference mark is judged to have been completed when the signal of an electron beam detected with the electron beam detecting section 4 reaches a predetermined level, the ending time of the reference mark preparation is known objectively and the shapes of the reference points become uniform. If the diameter of the electron beam for preparing the reference marks is made different from the diameter of the electron beam for detecting the image of the specimen 9 with the electron beam device 10, image recognition of the reference mark can be carried out smoothly. If the density of the electron beam for preparing reference marks is controlled to be greater than that of the electron beam while being moved over the reference template substrate 40b, formation of the reference mark is carried out with less deformation of the reference surface of the reference template substrate 40b associated with the formation of the reference mark.

This application is based on Japanese patent applications, Nos. 2001-062686, 2001-062687, and 2001-062688 filed in Japan on Mar. 6, 2001, which are entirely incorporated herein by reference.

The present invention will become more fully understood from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

BRIEF DESCRIPTION OF THE DRAWINGS

FIGS. 12(A) and 12(B) show differential operators for the process of sharpening an image of 3×3 pixels.

FIG. 13 illustrates to explain the process of dividing into segments an image formed with an image forming process section after the process of extracting feature points.

FIG. 14 is a plan view of an example of a specimen surface on which reference marks are formed.

DESCRIPTION OF PREFERRED EMBODIMENTS

Figure 1:
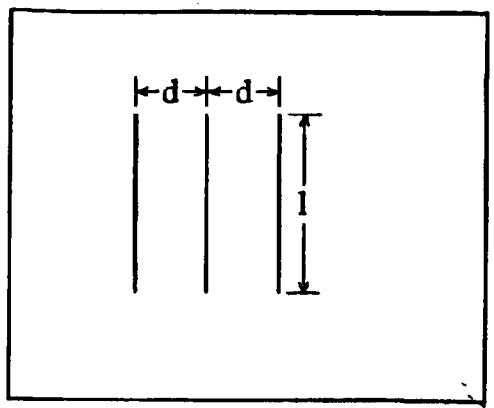
FIGS. 1(A) and 1(B) illustrate to explain pictures taken at specified tilt angles of an object, a pattern of three straight lines of the identical length, placed at equal intervals
Figure 1:
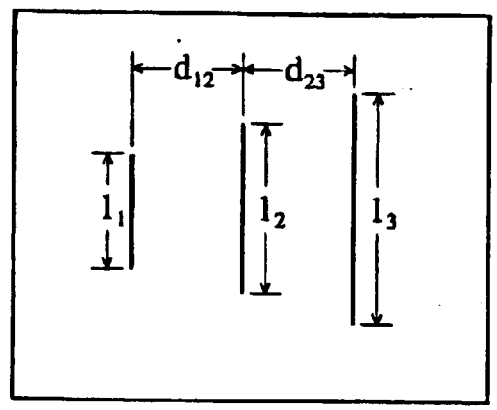

1. Principle of Measuring Three-dimensional Shapes Using Three-dimensional Images Before explaining the electron beam device of this invention, the principle of three-dimensional measurement will be hereinafter described in which deviation of images taken at different tilt angles is corrected so that the images may be observed three-dimensionally and at the same time three-dimensional measurement is carried out. FIG. 1 illustrates to explain three-dimensional pictures taken at specified tilt angles of an object, a pattern of three, equally spaced, equally long straight lines. FIG. 1(A) shows the image taken at a tilt angle of 0 degree (parallel) and FIG. 1(B) shows an image taken at a tilt angle of 10 degrees. While the three straight lines of the identical length appear with the identical length "1" at identical intervals "d" as shown in FIG. 1(A), the same three lines in FIG. 1(B) appear with different lengths of 11, 12 and 13 at different intervals of $d_{12}$, and $d_{23}$.

There are problems: three-dimensional viewing of the images of FIG. 1(A) and FIG. 1(B) using a stereo-meter (parallax measuring device), if attempted, is impossible and further it is impossible to accurately measure relative heights on the basis of the measurement of parallax difference. Still another problem is that stereo-matching by image correlation process for three-dimensional measurement, if attempted, cannot be made well because tilt angles of right and left images are different.

Figure 2:
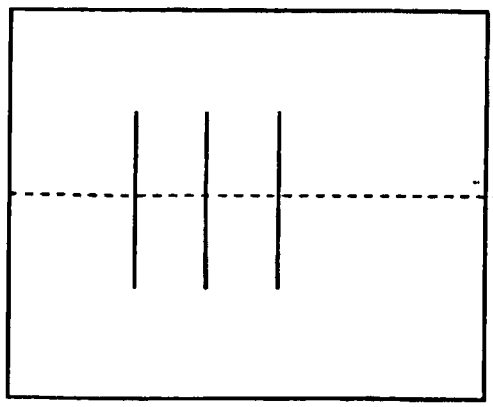
FIGS. 2(A) and 2(B) illustrate to explain three-dimensional images obtained by rectification of the tilted images shown in FIGS. 1(A) and 1(B).
Figure 2:
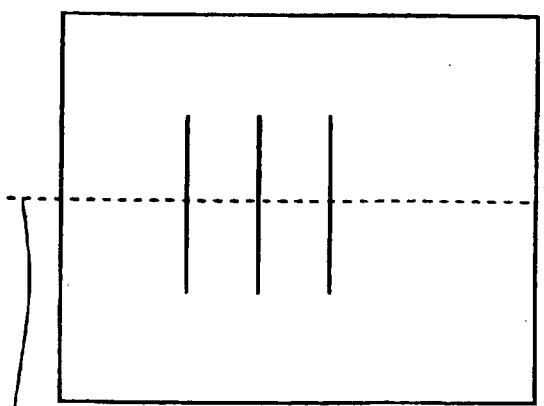

FIG. 2 illustrates to explain three-dimensional images obtained by correcting deviation of the tilted images shown in FIGS. 1(A) and 1(B). Both of FIGS. 2(A) and 2(B) show images with deviation corrected to parallel state. As a result of correcting deviation, tilted images of FIGS. 1(A) and 1(B) are changed to the images of FIGS. 2(A) and 2(B), with the images parallel to the object, with the scale equalized to eliminate vertical parallax, so that the images may be viewed in three dimensions. By using the three-dimensional images for three-dimensional viewing, corresponding points on the same epipolar line may be determined and therefore more accurate three-dimensional coordinates may be determined. To produce rectified images, reference point coordinates of at least three known points are required on the two images.

Using such reference points, it is possible to calculate the tilts and positions (called exterior orientating factors) of the two images. If such exterior orientating factors are known beforehand, deviation may be corrected. According to this invention, exterior orientating factors are determined by preparing in advance a reference template having reference marks serving as reference points, or by creating reference marks serving as reference points on the specimen while the image of the specimen surface is being taken using electron beams, and by correcting data through rectifying process. The three-dimensional images with deviation corrected may be used for stereovision and three-dimensional measurement.

2. First Embodiment

Figure 3:
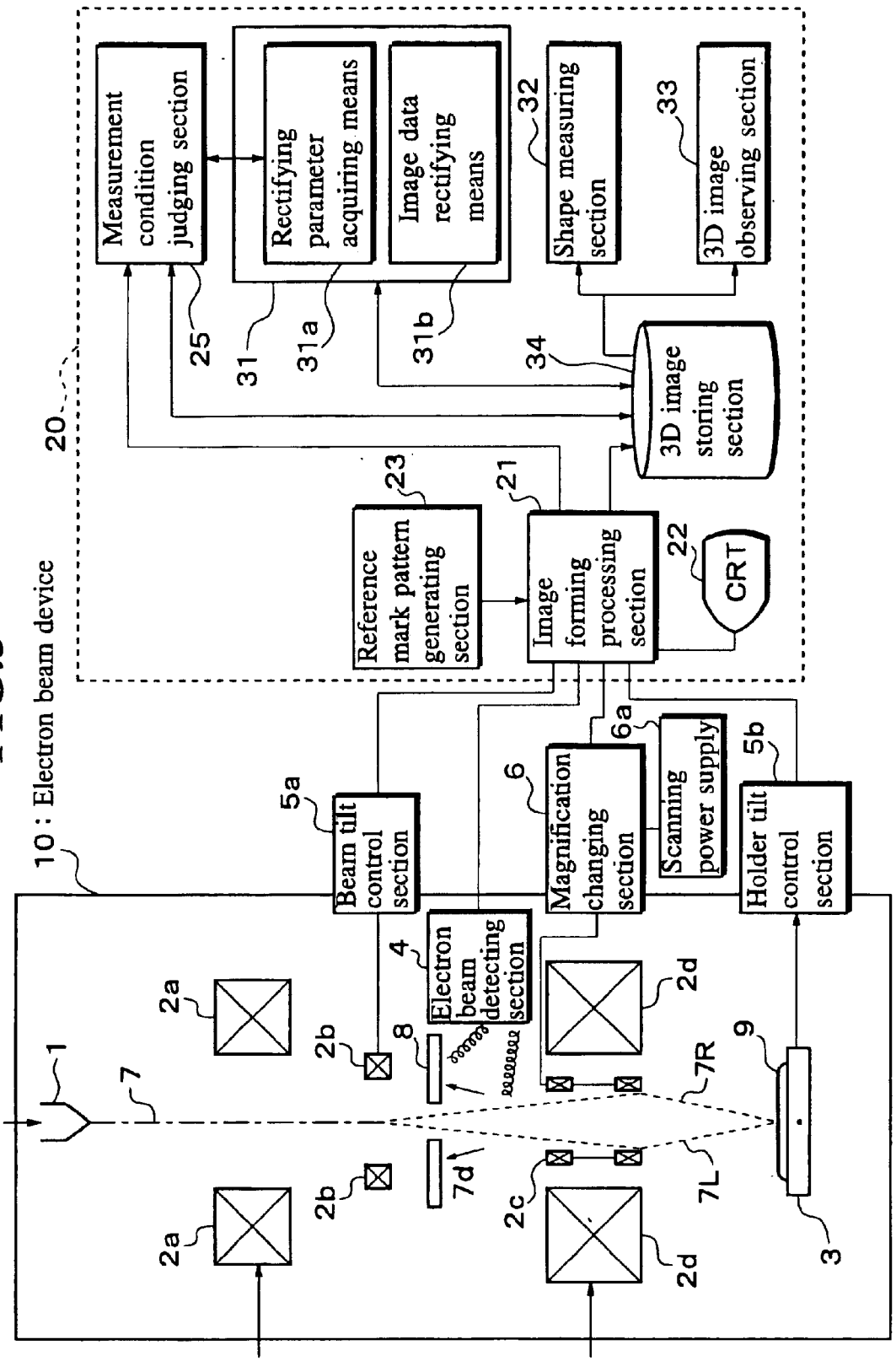
FIG. 3 is a block diagram of the first embodiment of this invention in the case of producing a three-dimensional image by deflecting the electron beam of a scanning electron microscope.

The first embodiment will be described in reference to appended drawings. FIG. 3 is a block diagram of the first embodiment of this invention, in which a three-dimensional image is produced by deflecting the electron beam of a scanning electron microscope. As shown, a scanning electron microscope or an electron beam device 10 comprises an electron beam source 1 for emitting an electron beam 7, an electron optical system 2 for irradiating the electron beam 7 onto a specimen 9, a specimen holder 3 capable of holding the specimen 9 at different tilt angles, a magnification changing section 6 for changing the magnifying power of the electron optical system 2, a scanning power supply 6a for supplying electric power to the magnification changing section 6, a detector 4 for detecting the electron beam 7, a tilt control section 5 or a beam tilt control section 5a for controlling the tilt of the electron beam 7, and a secondary electron converting target 8 for attenuating the energy of secondary electrons emitted from the specimen 9 and reflecting it to the detector 4. Incidentally, the tilt control section 5 or a holder tilt control section 5b for controlling the tilt of the specimen holder 3 is not used in the first embodiment but used in the second embodiment to be described later.

The electron optical system 2 comprises a condenser lens 2a for changing the electron flow density, diverging angle, and the irradiation area of the electron beam 7 emitted from the electron beam source 1, a deflection lens 2b for controlling the incident angle of the electron beam 7 to the specimen surface, a scanning lens 2c for scanning in two dimensions the specimen surface by deflecting the electron beam 7 with its diameter finely reduced, and an objective lens 2d for focusing the incident probe beam onto the specimen surface, also serving as a condensing lens in the final stage. A region on the specimen surface scanned with the scanning lens 2c using the electron beam 7 is determined according to a magnification changing command of the magnification changing section 6. The beam tilt control section 5a sends a tilt control signal to the deflection lens 2b so that the incident electron beam 7 is deflected to be the electron beam 7R or 7L to form different relative tilt angles between the specimen holder 3 and the electron beam 7. While the number of different tilt angles are not limited to two but may be any plural number, at least two is necessary for obtaining data for three-dimensional viewing.

The specimen 9 may be for example a chip of semiconductor such as a silicon semiconductor or a gallium arsenide semiconductor and may be also an electronic component such as a power transistor, a diode, or a thyristor, or display device components using glass such as a liquid crystal panel or an organic EL panel. Under typical observing conditions, the electron beam source is set to a potential of −3 kV and the specimen to −2.4 kV. Secondary electrons emitted from the specimen 9 with their energy attenuated as they bombard the secondary electron converting target 8 are detected with the detector 4. When the specimen 9 is set to the ground potential, the secondary electrons behave like mist with a low energy and can be detected directly with the detector 4, so that the secondary electron converting target 8 is not required.

The data processing device 20 comprises an image forming process section 21, a display device 22, a reference mark pattern generating section 23, a measurement condition judging section 25, a data correcting section 31, a shape measuring section 32, a three-dimensional image observing section 33, and a three-dimensional image storing section 34. Of those sections, the image forming process section 21, the display device 22, the reference mark pattern generating section 23 are also used as operation control sections for the electron beam device 10. The data processing device 20 is also provided to perform partial function of a control computer for controlling the working state of the electron beam device 10 or provided as connected to the control computer. Here, the control computer performs such functions as instructing a specimen handler to change the specimen and controlling the working conditions such as the vacuum condition of the electron beam device 10.

The image forming process section 21 forms an image of the specimen surface using the secondary electrons detected with the detector 4 as the specimen surface is scanned with the electron beam 7 through the scanning lens 2c. The display device 22 displays images formed with the image forming process section 21 so that an operator can view them, and is made of for, example a CRT or an LCD. The display device 22 may be an ordinary single screen monitor, or a monitor that can display in three dimensions, or both functions may be provided.

The reference mark pattern generating section 23 is to prepare reference marks on the specimen 9 by controlling the electron beam 7. The reference mark pattern generating section 23 is preferably provided with the function of extracting in advance feature points from the pattern shape or etching pattern of the specimen surface and determining the number and positions of reference marks when the number of already existing feature points is insufficient. Also when preparing reference marks on the reference template, it is preferable to store in the reference mark pattern generating section 23 the number and positions of the reference marks to be prepared.

The measurement condition judging section 25 judges measurement conditions using information on the magnification of the electron optical system 2 and on the type of the electron beam device 10. The types of the electron beam device 10 or the electron microscope include the transmission type and scanning type. The magnification of the electron optical system 2 is divided into low and high, and is used for example as a factor of determining whether the central or parallel projection is to be chosen to calculate the correction of the data detected at different tilt angles with the data correcting section 31.

The data correcting section 31 is to correct the deviation of the images formed with the image forming process section 21 to produce rectified images so that they can be viewed in three dimensions. In the case the correction is to be made in real time, the section 31 receives the measurement conditions for the electron microscope 10 directly from the image forming process section 21. Incidentally, in the case the images are once stored in the three-dimensional image storing section 34, the measurement conditions for the electron microscope 10 may be received from the measurement condition judging section 25, or the measurement conditions for the electron microscope 10 stored together with the images in the three-dimensional image storing section 34 may be used.

The shape measuring section 32 is to measure the three-dimensional shape of the specimen 9 on the basis of the three-dimensional images as corrected with the data correcting section 31. The three-dimensional image observing section 33 creates a three-dimensional image of the specimen 9 using the three-dimensional image data corrected with the data correcting section 31. The three-dimensional image storing section 34 stores the images formed with the image forming process section 21 and also stores the three-dimensional images corrected with the data correcting section 31. The three-dimensional image storing section 34 is to store image data created at the image forming process section 21 and the three-dimensional images corrected with the data correcting section 31 using an information storage medium such as a magnetic hard disk, a CR-ROM, a floppy disk, or a magneto-optical disk. In the case the three-dimensional image storing section 34 stores also the images that are created with the image forming process section 21 but their deviation is not corrected, it is preferable to store also the measurement conditions for the electron microscope 10.

The data correcting section 31 corrects data of the specimen 9 either directly using the specimen 9 having reference marks serving as reference positions or indirectly using a reference template having reference marks. When the specimen 9 has reference marks serving as reference positions, the data correcting section 31 corrects the deviation of the three-dimensional data by the use of the reference marks to produce rectified data.

To enable the correction of data of the specimen 9 using a reference template having reference marks, the data correcting section 31 has a rectifying parameter acquiring means 31a and an image data rectifying means 31b. The rectifying parameter acquiring means 31a acquires rectifying parameters for the three-dimensional data detected at relative tilt angles between the incident electron beam 7 and the specimen holder 3 for acquiring three-dimensional detection data using the reference marks on the reference template. The image data rectifying means 31b corrects the three-dimensional detection data of the specimen 9 into rectified data using the rectifying parameters obtained.

Figure 4:
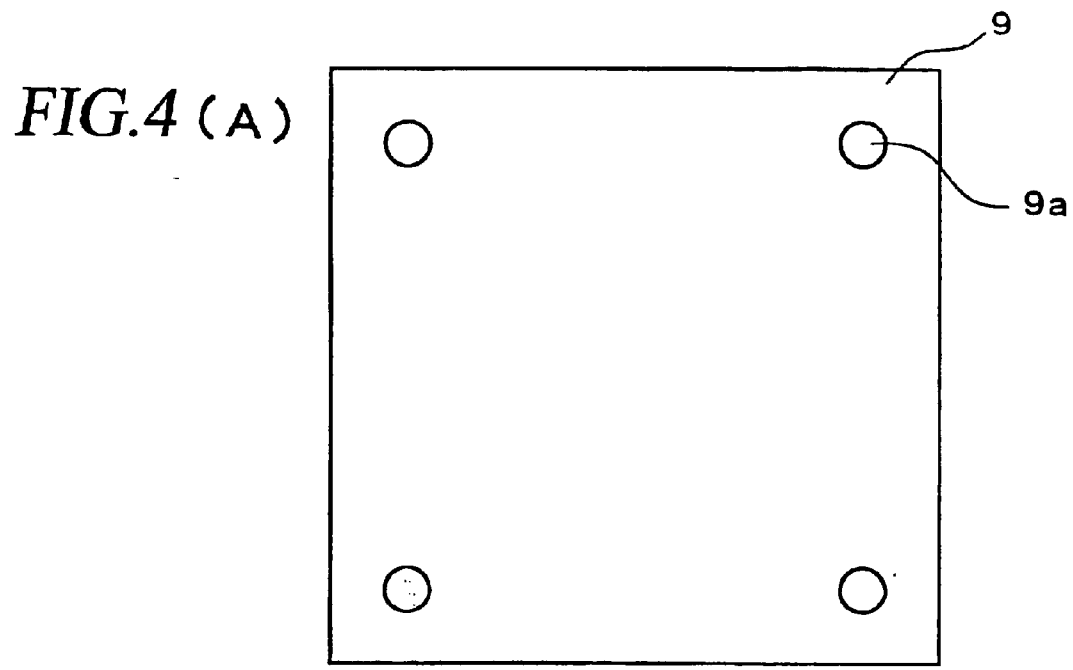
FIGS. 4(A), 4(B), and 4(C) illustrate to explain reference marks formed on a specimen or a reference template.
Figure 4:
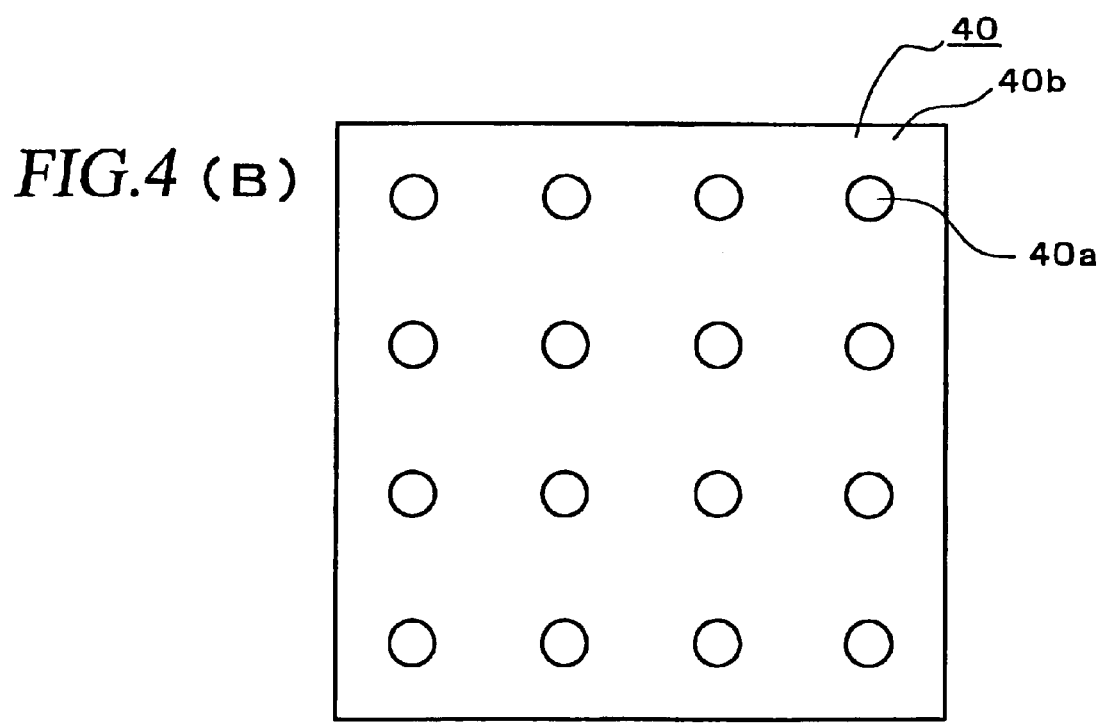
Figure 4:
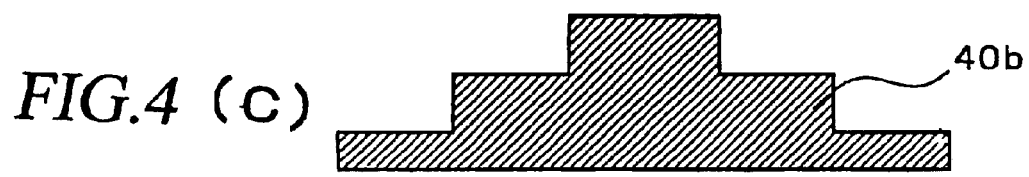

FIG. 4 illustrates to explain reference marks formed on the specimen or on the reference template, in which the FIG. 4(A) is a plan view with reference marks in four corners, FIG. 4(B) is a plan view with reference marks in a lattice pattern, and FIG. 4(C) is a cross-sectional view of a reference template for correcting lens distortion. As for the specimen 9, rectification using the data correcting section 31 is facilitated when the reference marks 9a are formed in four corners. The reference marks 9a are easier to use when at least three of them are distributed over as wide an area on the specimen 9 as possible. The reference marks 9a are the reference points with their necessary three-dimensional positions known. The reference marks 9a may be formed even on the reference template in its four corners. The reference template 40 is preferably one has a smooth, flat surface to be a reference surface for forming three-dimensional images, made of a material of the same composition as that of the specimen 9.

In the case the reference template 40 is used, since the reference marks 40a may be formed in any positions on the reference template 40, the reference marks 40a are formed for example in a lattice pattern. The reference marks 40a formed in a lattice pattern may be used for correcting the lens distortion of the electron beam in addition to exterior orientating factors. When the lens distortion of the electron beam is to be corrected using a flat reference template, it is necessary to take images in plural directions. The lens distortion of the electron beam may be accurately corrected when a stepped shape is formed on the reference template as shown in FIG. 4(C) and lattice pattern reference marks are provided on the edges of the steps, so that the reference marks have height components. Incidentally, there are several types of the lens distortion. As for the Seidel aberration, they are spherical, coma, curvature of field, astigmatism and distortion aberration. As for the chromatic aberration, its types include axial, magnification, and rotary aberration.

2.1 Method of Preparing Reference Marks on the Specimen or Reference Template Next will be described the method of preparing reference marks on the specimen or reference template. On the specimen 9 or reference template 40, the reference marks may be contamination or defects formed by positioning and irradiating the electron beam 7 using the reference mark pattern generating section 23. Use of the electron beam 7 enables very accurate positioning of the reference marks formed on the specimen 9 or reference template 4.

The contamination is a phenomenon in which hydrocarbon molecules are heated with the electron beam and adhere to the specimen. The size of the contamination increases with the diameter of the probe electron beam and its amount increases with the increase in the electron beam density and the irradiation time. The shape of the contamination is conical with a radially expanding foot. Therefore, when the probe electron beam is scanned slowly, the contamination is formed along the scanned line. To form the contamination of any intended shape and distribution, the probe electron beam is scanned and held for a specified period of time while controlling the beam diameter, electric current value, electron beam density, and irradiation time. To facilitate image processing, the reference marks are preferably 10 pixels or more and the incident beam diameter is greater than that of the pixel. It is preferable to set optimum values of controlling the electron beam irradiation to the reference mark pattern generating section 23.

When the contamination is easy to form, a beam shade may be provided in part of the irradiation system so that the electron beam 7 does not reach the specimen 9 while the beam is scanned over the specimen 9. It is also possible to feed back the level of the secondary electrons obtained from the detector 4 to the reference mark pattern generating section 23 to control the amount of contamination by adjusting the irradiation time of the electron beam 7.

Figure 5:
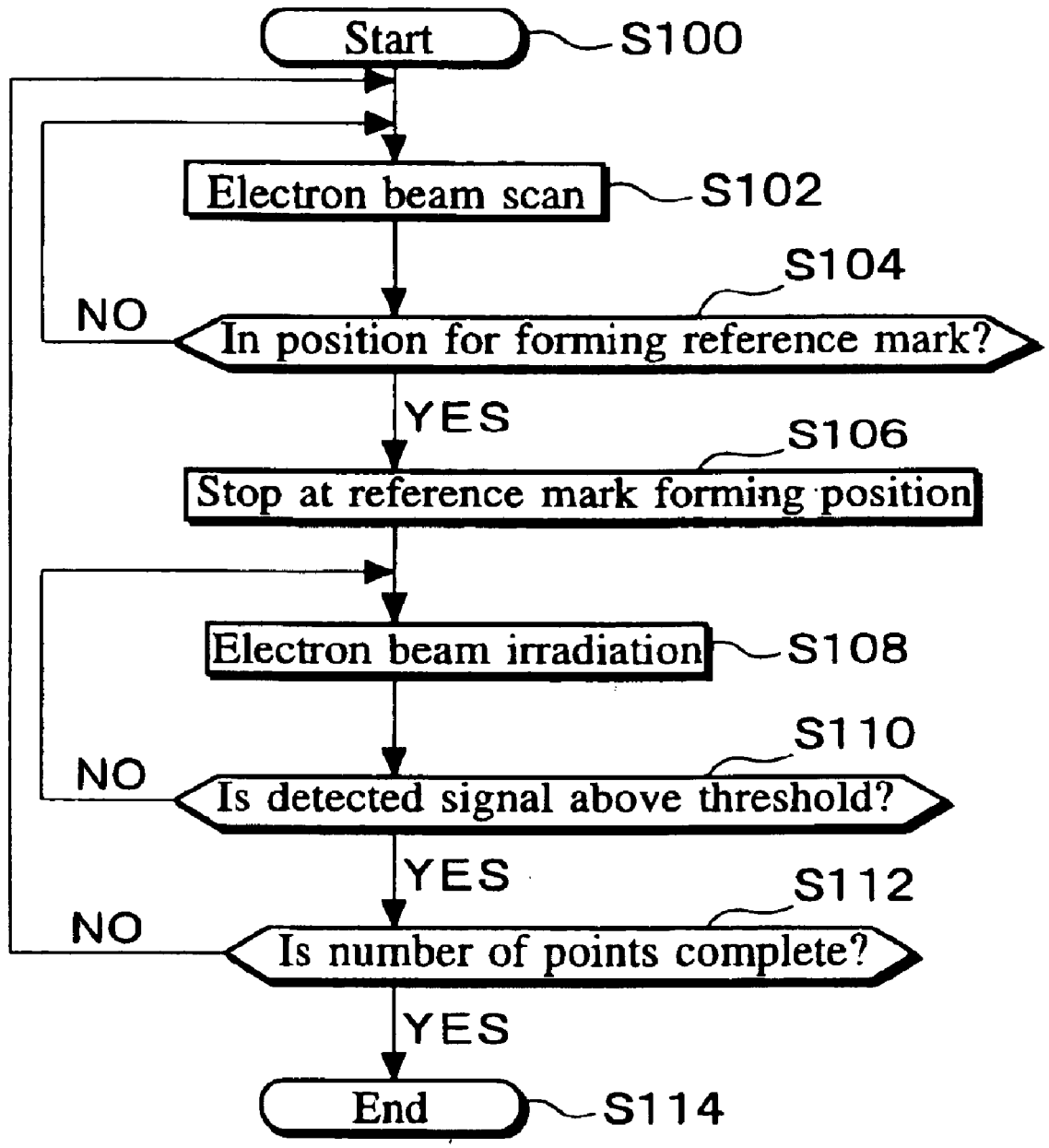
FIG. 5 shows a flow of steps of preparing reference marks on a specimen or a reference template.

FIG. 5 is a flowchart, showing the steps of producing preparing marks on a specimen or a reference template. First, a specimen 9 or a reference template substrate 40b on which reference marks are to be formed is placed on the specimen holder 3, and the reference mark pattern generating section 23 is caused to read the positions where the reference marks are to be formed (S100). While the electron beam 7 is being irradiated from the electron beam source 1, the electron beam 7 is scanned over the specimen 9 or the reference template substrate 40b (S102). Next, whether the electron beam 7 is irradiating a preprogrammed reference mark creating position is checked (S104). If the electron beam 7 is irradiating that position, the electron beam 7 is stopped in that position (S106) and the irradiation is continued (S108). Here, whether the signal obtained with the detector 4 is greater than a preset threshold is judged and, if not greater, the irradiation is continued at the reference mark creating position until the signal exceeds the threshold (S110). When the signal exceeds the threshold, whether a predetermined number of reference marks have been formed is checked (S112). In the case the number of formed reference mark does not reach the predetermined number, the process goes back to the step S102 to resume the scanning with the electron beam 7. If the number of formed reference mark reaches the predetermined number, the process is finished (S114).

Incidentally, when the reference template substrate has a stepped shape as shown in FIG. 4(C), the process of forming contaminated areas on the steps are as follows. First, any stepped shape may be made on the reference template substrate by repeating exposure and etching with a resist. Since the electron microscope has a deep focal depth, it is possible to form a reference mark of contamination in any position on the step by holding the electron beam probe in that position.

Figure 6:
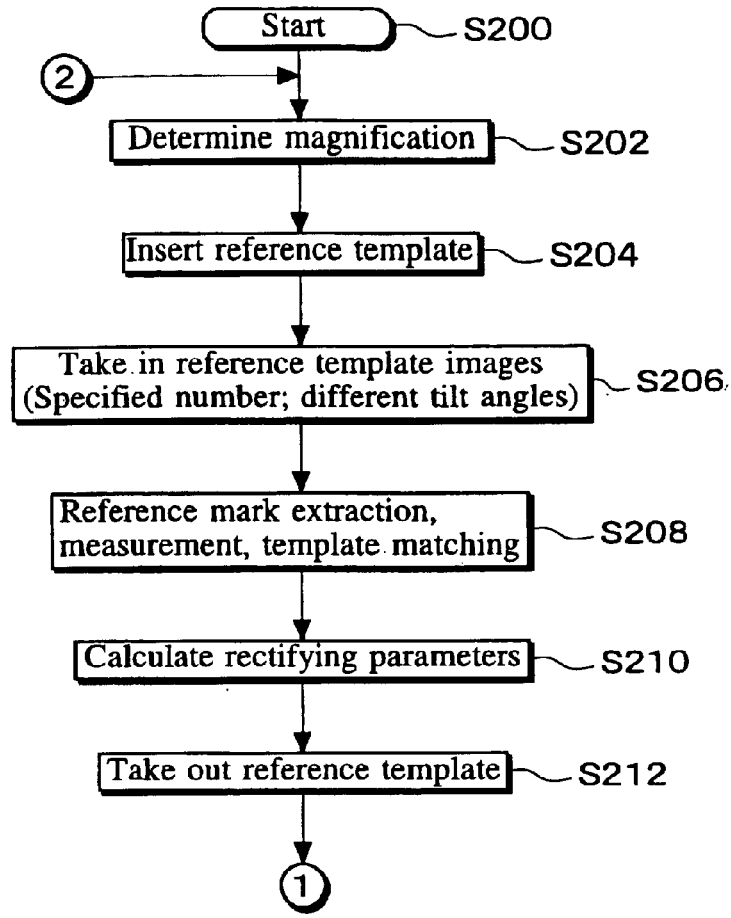
FIG. 6 shows a process flow of acquiring rectifying parameters using a reference template.

Procedure of acquiring rectifying parameters by the use of the reference template made as described above is described below. FIG. 6 shows a flowchart of acquiring rectifying parameters using a reference template. First, the magnification of the electron microscope is determined (S202). And whether the projection is central or parallel is determined with the measurement condition judging section 25 using the magnification of the electron microscope. The central and parallel projections will be described later. Next, the reference template 40 having reference marks is placed on the specimen holder 3 using a specimen handler (not shown) (S204). To correct exterior orientating factors, a reference template 40 with three or more reference marks is used. To correct also the lens distortion, a reference template 40 with multiple reference marks is used. However, the reference template 40 with multiple reference marks may also be used to correct only the exterior orientating factors.

The electron beam detecting section 4 detects the first and second detection data for the reference template 40 in the state of the first and second relative tile angles between the specimen holder 3 and the incident electron beam 7 (S206). To correct exterior orientating factors, the first and second relative tilt angles are set to be the same as those for measuring the specimen 9, and images are taken at least from two relative tilt angles. To correct the lens distortion, an image is taken from a third tilt angle (for example from a plus 3 direction) in addition to taking from two tilt angles that are the same as when measuring the specimen 9. Next, reference marks are extracted from the images taken through the method of image correlation process, and measurements are made (S208).

Figure 7:
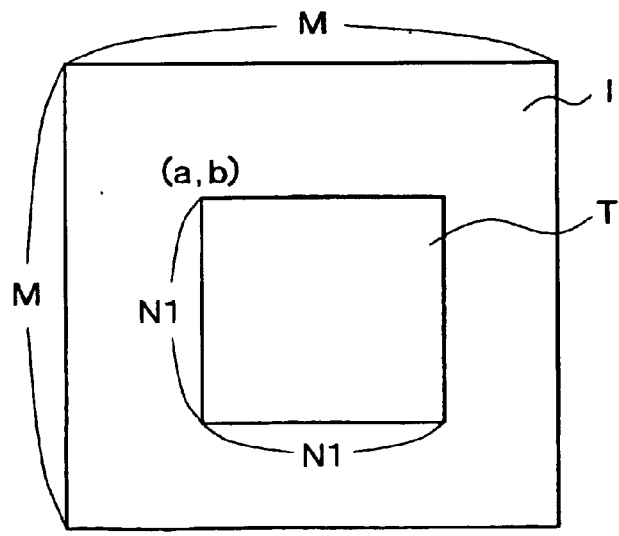
FIG. 7 illustrates to explain an image correlation process.

FIG. 7 illustrates to explain an image correlation process. In the figure, the searched image T is a small rectangle of N1×N1 in size with the left upper corner's coordinates of (a, b). The subject image I is a large rectangle of M×M. The processing of image correlation may be performed with the normalizing correlation method or the residual sequential analysis (SSDA). The SSDA increases the speed of processing. The SSDA uses the following equation:

$$R(a, b) = \sum_{m1=0}^{N1-1} \sum_{n1=0}^{N1-1} |I_{(a,b)}(m1 - n1) - T(m1, n1)| \quad (1)$$

where $T(m_1, n_1)$ is a searched image, $I_{(a,b)}(m_1, n_1)$ is a partial image of the subject image, (a,b) are coordinates of the upper left corner of the searched image, and R(a,b) is a residual. The point of minimum residual R(a,b) is the position of the searched image. To increase the speed of calculating process, addition using the equation (1) is stopped when the value of R(a,b) exceeds the minimum value of the past residual and is moved to the next R(a,b).

Referring to the flowchart of FIG. 6 again, rectifying parameters are calculated for relative tilt angles between the incident electron beam 7 and the specimen holder 3 for obtaining three-dimensional data using the reference marks (S210). Rectifying parameters are calculated from the coordinates of the image of the measured reference marks and from the actual coordinates, using the equations (2) to (4) in the case of the central projection, or using the equations (5) and (6) in the case of the parallel projection, which will be described later. In the case the lens distortion is to be corrected as well, the rectifying parameters are calculated by the use of the equation (7). Acquisition of the rectifying parameters is completed by taking out the reference template 40 from the specimen holder 3 (S212).

2.2 Parallel Projection and Central Projection

Figure 8:
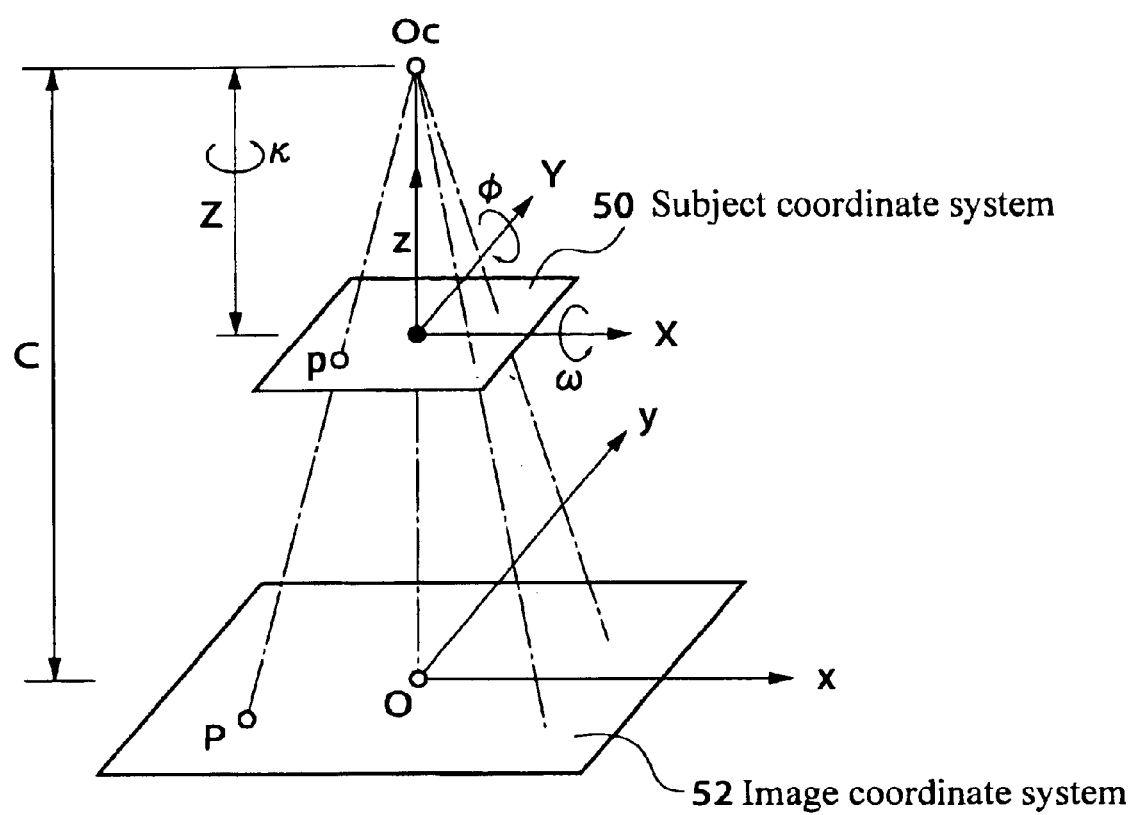
FIG. 8 illustrates to explain a central projection.

Because of a wide range of low to high magnification (for example from several times to several million times) of the electron microscope, the electron optical system 2 may be deemed to work by the central projection at low magnifications and by the parallel projection at high magnifications. The magnification at which switching is made between central and parallel projection is preferably determined in consideration of the calculation accuracy of the rectifying parameters. The switching magnification is chosen for example between 1,000 and 10,000. FIG. 8 illustrates the central projection. In the case of the central projection, a subject coordinate system 50 for the specimen 9 and an image coordinate system 52 for the detector 4 are relatively positioned with respect to the projection center Oc as shown in FIG. 8. Coordinates of an object such as a reference mark in the subject coordinate system are assumed to be (X, Y, Z) and the coordinates of the projection center Oc to be (Xo, Yo, Zo). Coordinates in the image coordinate system 52 are assumed to be (x, y) and the distance from the projection center Oc to the image coordinate system 52 is assumed to be C. Here, the following equation holds true for the central projection:

$$\begin{bmatrix} x \\ y \\ -C \end{bmatrix} = k \begin{bmatrix} a_{11} & a_{12} & a_{13} \\ a_{21} & a_{22} & a_{23} \\ a_{31} & a_{32} & a_{33} \end{bmatrix} \begin{bmatrix} X - X_0 \\ Y - Y_0 \\ Z - Z_0 \end{bmatrix} \quad (2)$$

where k is a constant, $a_{ij}$ (i=1, 2, 3; j=1, 2, 3) denotes elements of rotary matrix. Solution of the equation (2) with respect to coordinates (x, y) in the image coordinate system 52 yields the following equations:

$$\begin{cases} x = -C(X - X_0)a_{11} + (Y - Y_0)a_{12} + \dfrac{(Z - Z_0)a_{13}}{(X - X_0)a_{31} + (Y - Y_0)a_{32} + (Z - Z_0)a_{33}} \\ y = -C(X - X_0)a_{21} + (Y - Y_0)a_{22} + \dfrac{(Z - Z_0)a_{23}}{(X - X_0)a_{31} + (Y - Y_0)a_{32} + (Z - Z_0)a_{33}} \end{cases} \quad (3)$$

The elements $a_{ij}$ of the rotary matrix may be expressed as follows using the tilts ω, φ and κ relative to the three axes X, Y and Z constituting the subject coordinate system of the image coordinate system 52:

$$\begin{pmatrix} a_{11} = \cos\omega\cos\phi, & a_{12} = -\cos\omega\sin\phi, & a_{13} = \sin\omega \\ a_{21} = \cos\kappa\sin\phi + \sin K\sin\omega\cos\phi, & a_{22} = \cos\kappa\cos\phi - \sin K\sin\omega\sin\phi, & a_{23} = -\sin\kappa\cos\omega \\ a_{31} = \sin\kappa\sin\phi - \cos K\cos\omega\cos\phi, & a_{32} = \sin\kappa\cos\phi + \cos K\sin\omega\sin\phi, & a_{33} = \cos\kappa\cos\omega \end{pmatrix} \quad (4)$$

Figure 9:
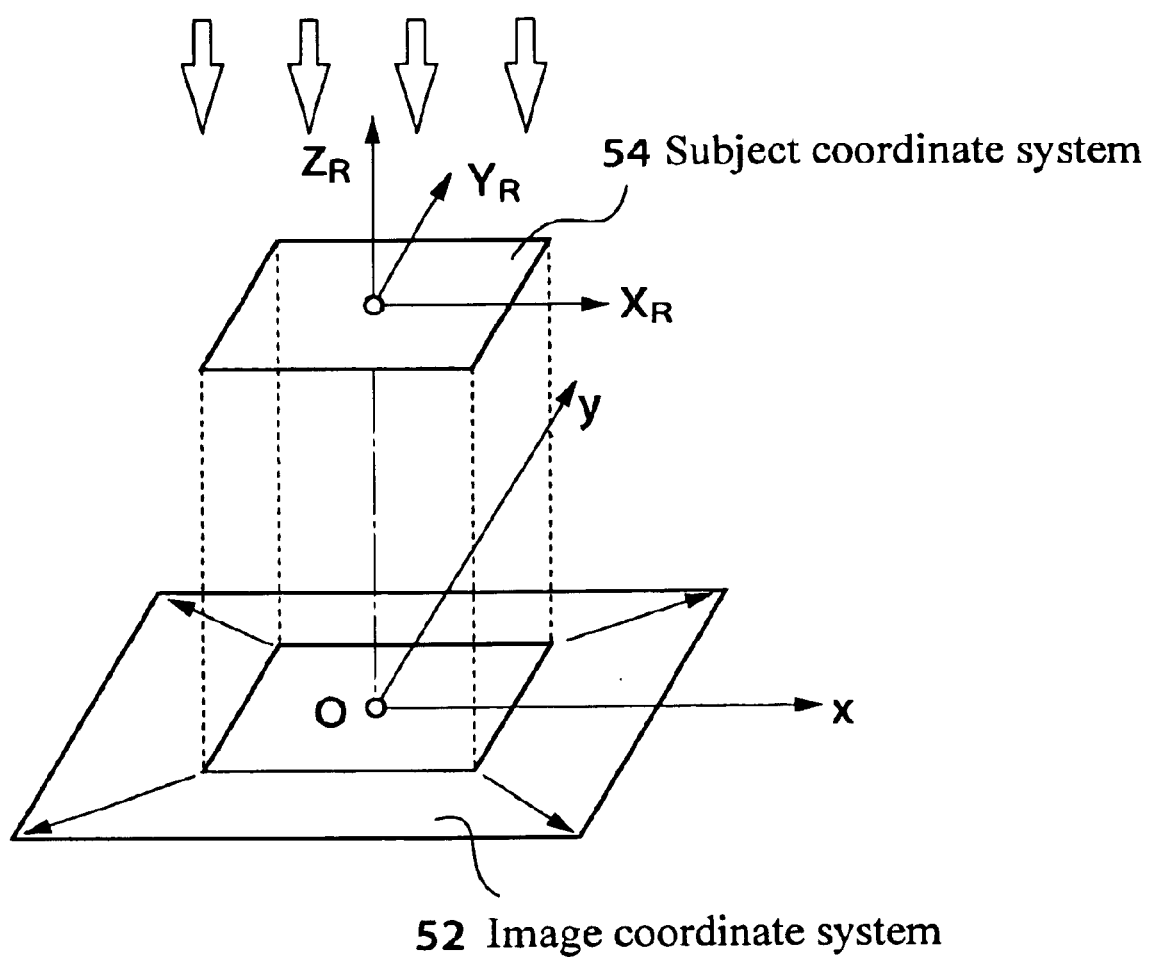
FIG. 9 illustrates to explain a parallel projection.

FIG. 9 illustrates the parallel projection. As for the parallel projection, there is no point corresponding to the projection center Oc of the central projection. Therefore, when scale coefficients $K_1$ and $K_2$ are chosen using a coordinate system $(X_R, Y_R, Z_R)$ as the coordinate system 54 in consideration of rotation, the following equation is established:

$$\begin{bmatrix} x \\ y \\ 0 \end{bmatrix} = \begin{bmatrix} K_1 & 0 & 0 \\ 0 & K_2 & 0 \\ 0 & 0 & 0 \end{bmatrix} \begin{bmatrix} X_R \\ Y_R \\ Z_R \end{bmatrix} \quad (5)$$

The above equation may be expressed as follows using an origin (Xo, Yo, Zo) chosen in the subject coordinate system 54 and an orientation matrix A:

$$\begin{bmatrix} X \\ Y \\ Z \end{bmatrix} = A \begin{bmatrix} X - X_0 \\ Y - Y_0 \\ Z - Z_0 \end{bmatrix} \quad (6)$$

Here, a relationship corresponding to the equation (4) exists for the elements $a_{ij}$ of the orientation matrix A.

By the calculation of rectifying parameters, six exterior orientating elements ω, φ, κ, Xo, Yo, and Zo included in the equations (2) to (4), or in the equations (5) and (6) are determined. That is to say, at S210, using those equations and at least three reference marks, observation equations are established, and those six exterior orientating elements are determined by successive approximations. To put it concretely, those six exterior orientating elements may be determined by successive approximation in which an approximate value of unknown variable is assumed and made linear by Tailor evolution around the approximate value, a correction amount is determined by the least squares method to correct the approximate value, and a convergent solution is determined by repeating the same operation. Alternatively, instead of using the equations (2) to (4), or equations (5) and (6), appropriate calculating equations may be chosen from various equations used for exterior orientating such as the single picture orientating, mutual orientating and other aero-triangulation.

2.3 Correcting Lens Distortion

In order to determine also the distortion aberration of the electron lens constituting the electron optical system 2, correction is made by preparing additional reference marks, taking images from plural directions, and using the equations (7) and (8). That is to say, assuming that the coordinates (x', y') are the result of correcting the coordinates (x, y) for which the lens distortions are corrected using the equations (2) to (4), or the equations (5) and (6), the following equations hold true:

$$x' = x + \Delta x$$
$$y' = y + \Delta y \quad (7)$$

Here, assuming that $k_1$ and $k_2$ are coefficients of lens distortion in the radial direction, Δ x and Δ y are expressed with the following equations:

$$\Delta x = x_0 + x(k_1 r^2 + k_2 r^4)$$
$$\Delta y = y_0 + y(k_1 r^2 + k_2 r^4)$$
$$r^2 = (x^2 + y^2)/c^2 \quad (8)$$

The distortion aberration of the electron lens may be calculated by successive approximation substituting measured values of the image coordinates and the subject coordinates in the above equations. While the coefficient of lens distortion in the equation (8) is assumed to be related to the radial lens distortion, by adding other elements necessary for correcting other types of distortion aberration of the electron lens such as tangential lens distortion and spiral lens distortion to the equation (8) and obtaining coefficient of lens distortion, it is possible to calibrate them.

Figure 10:
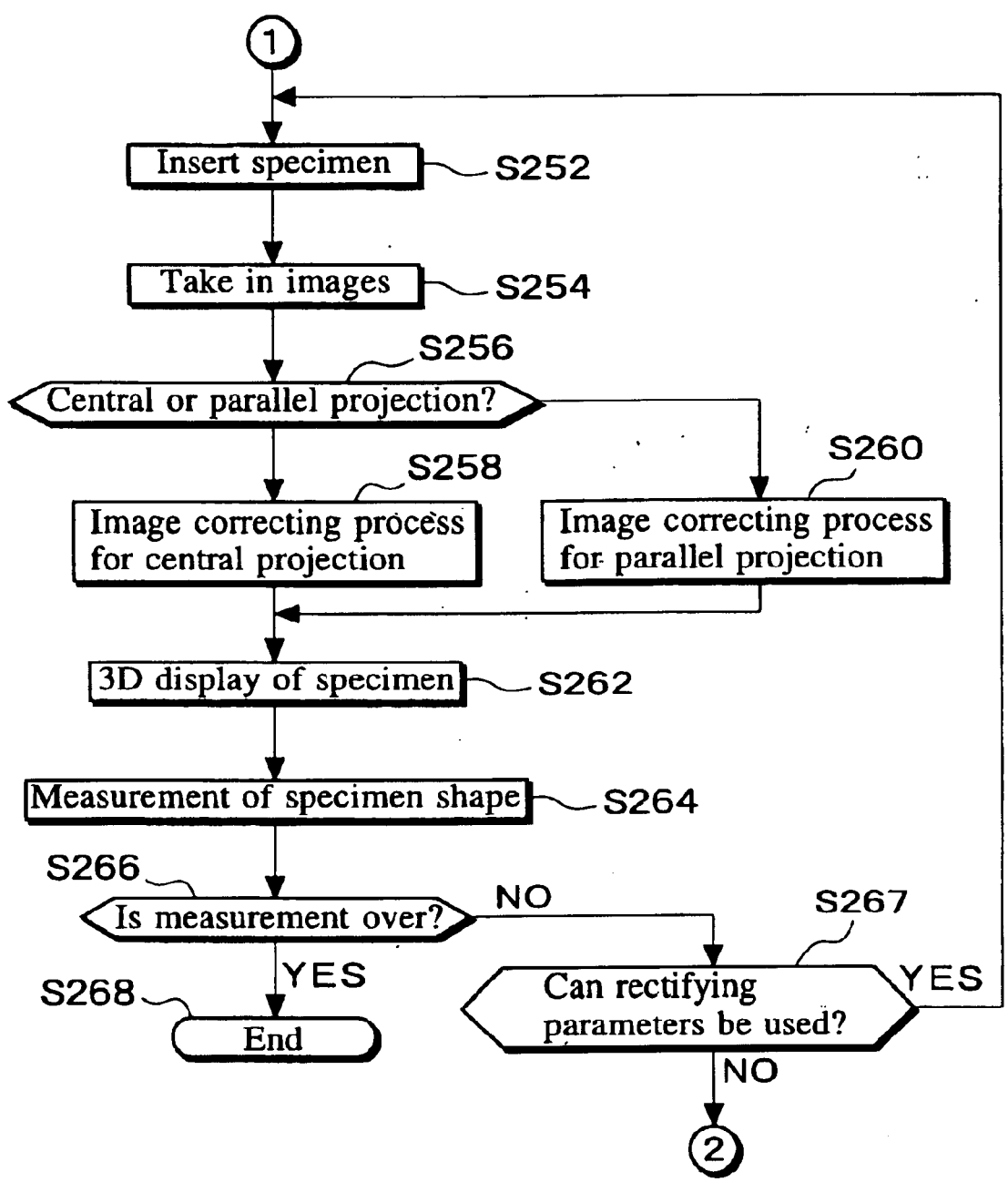
FIG. 10 is a flowchart of steps of processing a three-dimensional image of a specimen using rectifying parameters.

Next will be described the steps of processing three-dimensional images of the specimen after obtaining the rectifying parameters. FIG. 10 is a flowchart of steps of processing three-dimensional images of a specimen using rectifying parameters. First, using a specimen handler (not shown), the specimen 9 to be observed and measured is placed on the specimen holder 3 (S252). Next, the first and second detection data for the stereovision of the specimen 9 are detected with the electron beam detecting section 4 by setting two or more tilt angles of the electron beam 7 relative to the specimen holder 3 using the beam tilt control section 5a, and the images are taken in (S254). The two or more tilt angles are set to be the same as the first and second relative tilt angles between the electron beam 7 and the specimen holder 3 used for obtaining the rectifying parameters at S206.

Next, it is determined whether the images of the specimen 9 should be taken by the central or parallel projection according to the magnification set with the magnification changing section 6 (S256). In the case of the central projection, the subject coordinates are converted to a coordinate system in which stereovision is to be displayed by using the rectifying parameters, the six exterior orientating factors ω, φ, κ, Xo, Yo, and Zo. Values of the corresponding pixels on the image coordinate system are substituted in the equations (2) to (4) and rearranged to produce using the data correcting section 31 three-dimensional rectified images to be detected with the detector 4 (S258). In the case of parallel projection, the subject coordinates are converted to a coordinate system in which stereovision is to be displayed by using the rectifying parameters, the six exterior orientating factors ω, φ, κ, Xo, Yo, and Zo. Values of the corresponding pixels on the image coordinate system are substituted in the equations (5) and (6) and rearranged to produce using the data correcting section 31 three-dimensional rectified images to be detected with the detector 4 (S260).

The three-dimensional images with their deviation corrected with the rectifying parameters are temporarily stored in the three-dimensional image storing section 34 and simultaneously displayed three-dimensionally with the three-dimensional image observing section 33 (S262). In the case a stereovision monitor such as the three-dimensional image observing section 33 is not provided, the operator can make a stereovision possible by displaying two images on a single screen of the display device 22.

Next, using the shape measuring section 32, part of the specimen 9 to be measured in three dimensions is measured using the three-dimensional images for which deviation has been corrected with the data correcting section 31 (S264). Three-dimensional measurement values are calculated with the principle of triangulation by measuring right and left images displayed in three dimensions (horizontal parallax is determined). Measurement of right and left images may be carried out manually or through an image correlation process.

Next, whether the measurement is over is judged by the operator or with a control computer (not shown) that controls the working state of the electron beam device 10 (S266). If the measurement is to be continued, it is determined whether the rectifying parameters already obtained can be used (S267). In the case a different specimen is to be measured at the same magnification or in the case the magnification of the electron microscope is reproducible even when measurement is to be made at a different magnification, the process goes back to S252 to repeat measurement using the rectifying parameters already obtained. In the case the magnification of electron microscope is not reproducible, since the rectifying parameters already obtained cannot be used, the process must go back to S202 shown in FIG. 6 and the rectifying parameters matching the magnification are calculated from the beginning using the reference template 40. When the measurement is over, the specimen 9 is drawn out from the specimen holder 3 (S268).

Figure 11:
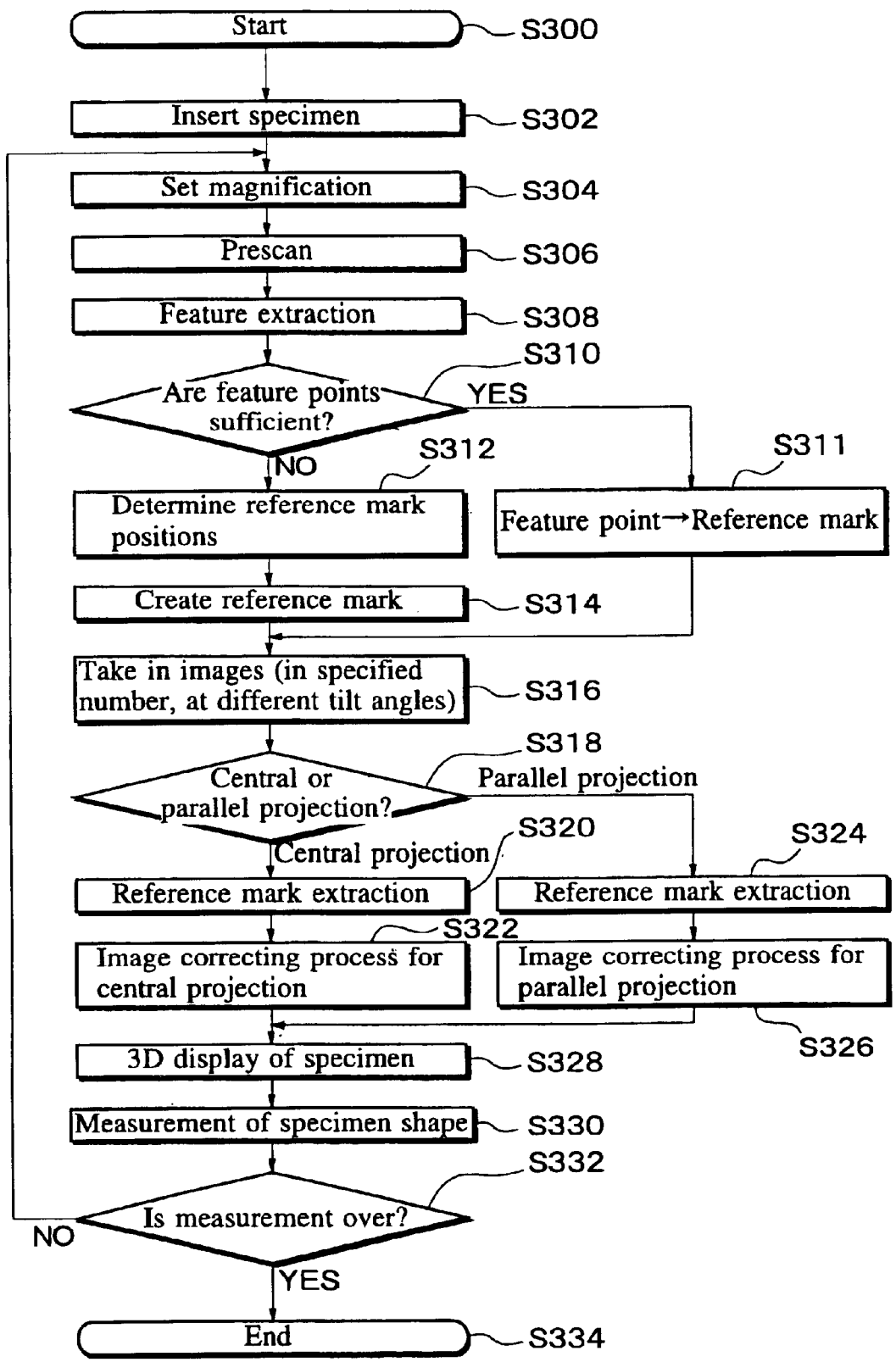
FIG. 11 is a flowchart of steps of observing three-dimensional images using reference marks present on a specimen.

FIG. 11 is a flowchart of steps of stereovision observation of images using reference marks present on the specimen. First, the specimen 9 is inserted onto the specimen holder 3 using a specimen handler (not shown) (S302). Next, a magnification for viewing or measuring the specimen 9 is set with the magnification changing section 6 (S304). And the surface of the specimen 9 is pre-scanned with the electron beam 7 at a preset magnification (S306). Secondary electrons are detected with the detector 4 during the pre-scanning and images are produced with the image forming process section 21. Feature points are extracted with the reference mark pattern generating section 23 from the images formed with the image forming process section 21 (S308). Here, the feature points are those like the reference marks that can be clearly recognized in positions suitable for calculating the rectifying parameters.

2.4 Process of Extracting Feature Points

Here, the feature point extraction process carried out with the reference mark pattern generating section 23 is described. Image sharpening process is carried out by assuming input images to be f(i, j) and Laplacean of the input images to be $\nabla^2 f(i, j)$:

$$g(i, j) = f(i, j) - \nabla^2 f(i, j) \tag{9}$$

Here, g(i, j) denotes sharpened images. As for the Laplacean $\nabla^2 f(i, j)$ of the input images, there are various differential operators such as the Laplacean operator and line detecting operator.

FIG. 12 shows differential operators for the process of sharpening an image of 3×3 pixels, FIG. 12(A) shows differential operators and FIG. 12(B) Laplacean operators. The sharpening process is carried out by assigning a greater weight to the central pixel and a smaller weight to the surrounding pixels. Incidentally, the differential operator for the image sharpening process may be made by applying correction of weighting with Gauss curve to the differential operators for the 3×3 pixels shown in FIG. 12.

After the image sharpening process, an edge extracting process is carried out. The edge extracting process may be done by assuming the point to be an edge where the shade value of the sharpened image changes its sign. That is to say, the point of zero only is made into an image, or the positive area above zero is made white and the negative area below zero is made black to make an image.

In place of the digital image processing using the equation (9), it may be obtained by a calculation process as shown with the equation below:

$$\nabla^2 G(x, Y) = \frac{x^2 + y^2 - 2a^2}{2\pi a^6} \exp(-(x^2 + y^2)/2a^2) \tag{10}$$

The equation (10) is one that includes measures for attenuating sudden change in the shade with a Gauss curve in the calculating process.

Referring again to FIG. 11, the reference mark pattern generating section 23 judges whether the position and the number of the feature points are sufficient (S310) and, if sufficient, the feature points are used to be reference points (S311). If insufficient, in addition to using the existing feature points as reference marks, positions where additional reference marks are to be formed are determined (S312) and the reference marks are created with the reference mark pattern generating section 23 (S314). To judge whether the position and the number of the feature points are sufficient, it is preferable to judge after dividing the image created with the image forming process section 21 into segments.

FIG. 13 illustrates the process of dividing into segments an image formed with the image forming process section after the process of extracting feature points. The image created with the image forming process section 21 is divided for example into four segments: A, B, C and D. It is preferable that dividing into segments is made such that each segment is uniform in area and shape and has one or two feature points. In the case any segment does not have a feature point, a position for creating a reference mark should be determined.

FIG. 14 is a plan view, showing an example of a specimen surface on which reference marks are formed. The specimen 9 is assumed to be a semiconductor substrate having a predetermined pattern 9b as shown, and with reference marks 9a formed in four corners. Such reference marks 9a may be easily detected by assuming the specimen surface to be a subject image I and matching a search image T having standardized reference marks.

Referring again to FIG. 11, the electron beam 7 is switched to 7R and 7L by controlling the tilt angle of the electron beam 7 using the beam tilt angle control section 5a to take in required number of images with the image forming process section 21 (S316). According to the magnification set with the magnification changing section 6, method of calculating the rectifying parameters with the data correcting section 31, whether by the central projection or parallel projection, is chosen (S318). Next, coordinates of reference marks in the images are searched (S320 and S324). As shown in FIG. 13, since in which segment the reference marks are is known, their areas are searched and detected as shown in FIGS. 7 and 14 by image correlating process.

In the case of the central projection, the data correcting section 31 calculates the rectifying parameters using the above equations (2) to (4) from the coordinates in the image coordinate system of the reference marks detected. Using the rectifying parameters, namely the six exterior orientating factors $\omega$, 100, $\kappa$, Xo, Yo, and Zo, the subject coordinate system is convert to the coordinate system in which three-dimensional display is intended, the values are substituted in the equations (2) to (4), values of the pixels in the image coordinate system are substituted and rearranged, and the rectified three-dimensional images to be detected with the detector 4 are created with the data correcting section 31 (S322).

In the case of parallel projection, the rectifying parameters are calculated using the above equations (5) and (6). If also the lens distortion is to be corrected, rectifying parameters are calculated using the equation (7). Using the six exterior orientating factors $\omega$, $\phi$, $\kappa$, Xo, Yo, and Zo, the subject coordinate system is converted to the coordinate system in which three-dimensional display is intended, the values are substituted in the equations (5) and (6), values of the pixels in the image coordinate system are substituted and rearranged, and the rectified three-dimensional images to be detected with the detector 4 are created with the data correcting section 31 (S326).

Next, the rectified images for stereovision are displayed on the three-dimensional image observing section 33 to make stereovision possible (S328). Next, using the shape measuring section 32 and the images corrected with the data correcting section 31 for stereovision, an intended area of the specimen 9 is measured in three dimensions (S330). And whether the measurement is over is judged with a control computer (not shown) that controls the working state of the operator or the electron beam device 10 (S332). In the case measurement of another specimen is to be made at the same magnification, or to carry out at a different magnification, the process goes back to the step S304 to repeat the measurement. When the measurement is over, the specimen 9 is drawn out from the specimen holder 3 (S334). In the case the same specimen 9 is to be measured at a different magnification, whether the reference marks already created can be used as feature points is determined by the feature extracting process of the step S308. If the reference marks prove to be usable as feature points, they are used. If not, reference marks are newly created (S312 and S314).

Incidentally, while the process shown in FIG. 11 is automatically carried out through the image forming process section 21, the process may be carried out manually by an operator while watching pre-scanned images displayed on the display device 22.

3. Second Embodiment

Figure 15:
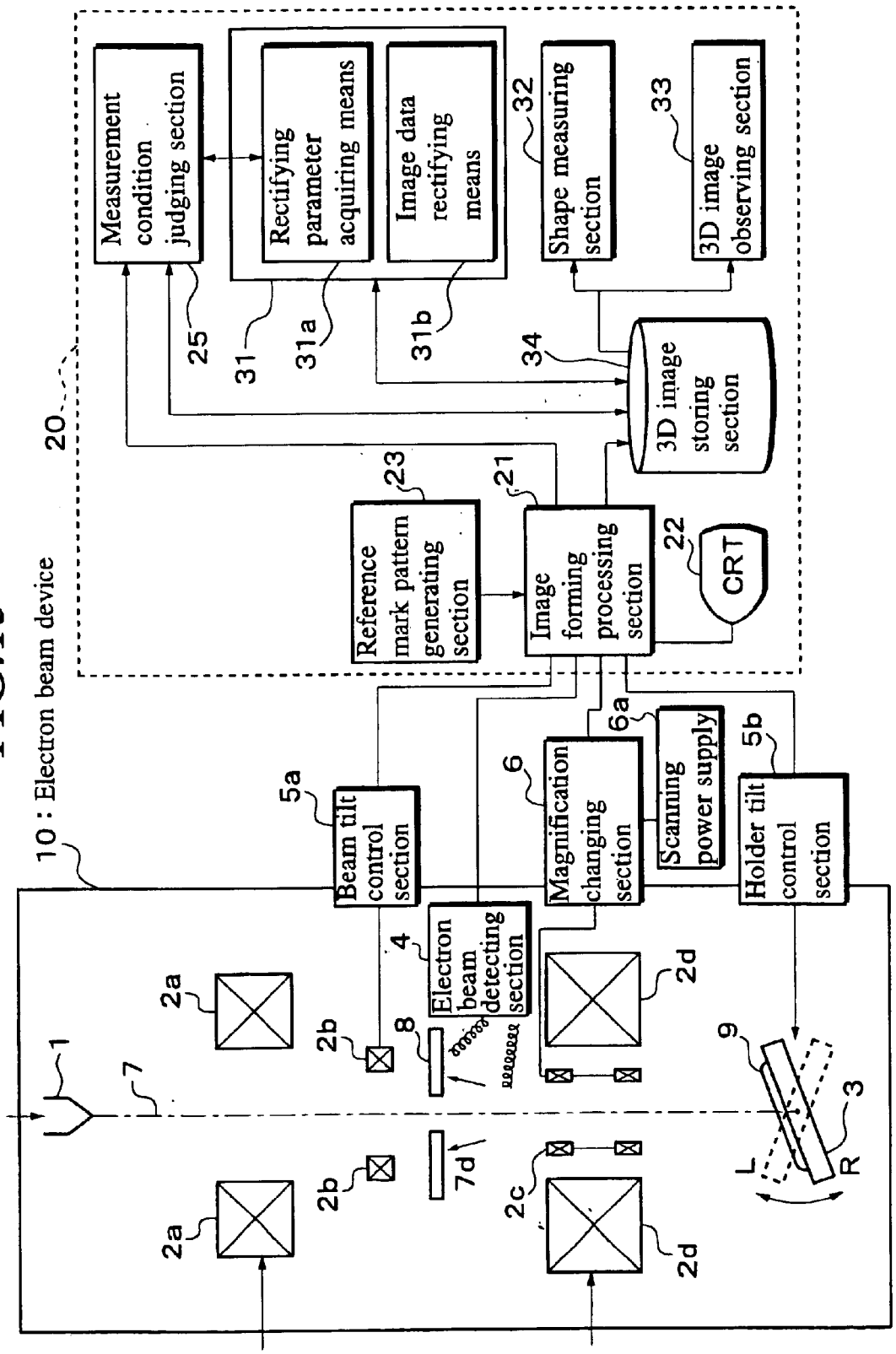
FIG. 15 is a block diagram of the second embodiment of this invention in the case of taking three-dimensional images using a scanning electron microscope with the specimen holder at different tilt angles.

FIG. 15 is a block diagram of the second embodiment of this invention in the case of taking three-dimensional images with a scanning electron microscope with the specimen holder at different tilt angles. In the second embodiment, the holder tilt control section 5b is used as the tilt control section 5 for the specimen holder 3 and the beam tilt angle control section 5a is not operated. Here, two relative tilt angles are produced between the specimen holder 3 and the electron beam 7 with the holder tilt control section 5b. One relative tilt angle is produced when the right edge of the specimen holder 3 is raised as shown with the symbol R and the other relative tilt angle is produced when the specimen holder 3 is tilted with its left edge raised as shown with the symbol L. While the number of tilt angles is not limited to two but may be any plural number, two is a minimum for obtaining images for stereovision. Taking images with the detector 4 at specified angles ($\pm\theta$) of the specimen 9 is equivalent to taking images with the detector 4 at specified angles ($\pm\theta$) of the incident electron beam 7 with the specimen 9 fixed.

The raw images detected with the device constituted as described above, like those of the first embodiment, are also rectified for stereovision. Methods of correcting the deviation include one in which a reference template is used as shown in FIGS. 6 and 10 to determine rectifying parameters and to process images for stereovision, and the other in which reference marks of the specimen are used as shown in FIG. 11 to process images directly for stereovision.

4. Third Embodiment

Figure 16:
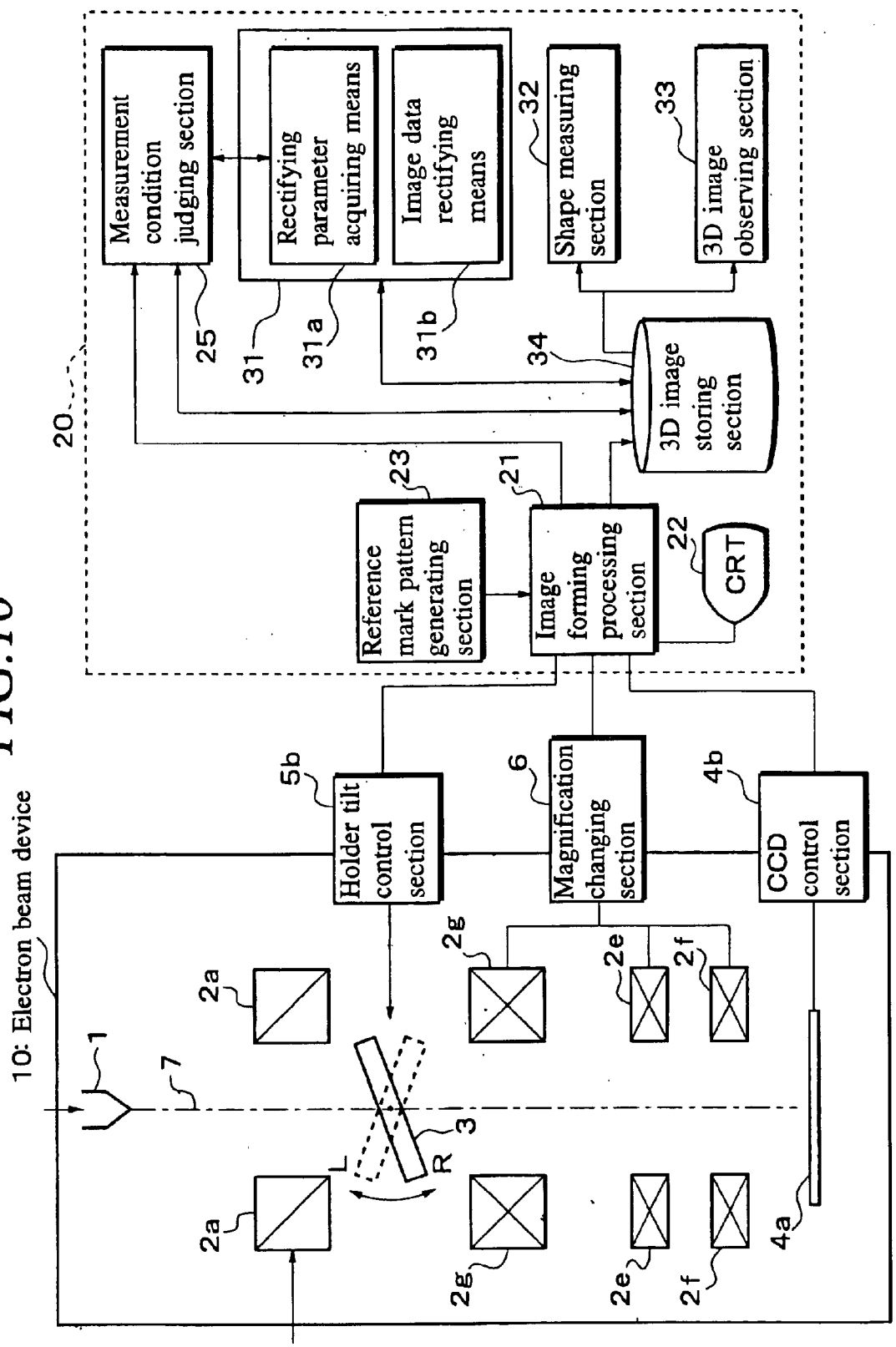
FIG. 16 is a block diagram of the third embodiment of this invention in the case of taking three-dimensional images using a transmission electron microscope with the specimen holder at different tilt angles.

FIG. 16 is a block diagram of the third embodiment of this invention in the case of taking three-dimensional images with a transmission electron microscope with the specimen holder set to different tilt angles. Since the electron beam device 10 is a transmission electron microscope, the electron beam detecting sections 4a and 4b are located opposite to the electron beam source 1 beyond the specimen holder 3. The electron optical system 2 is made up of a first electron optical system and a second electron optical system that directs the electron beam 7 passing through the specimen 9 to the detector 4a, such as a CCD (charge-coupled device). As the first electron optical system, a condenser lens 2a is provided to change the electron flow density, divergent angle, and irradiation area of the electron beam 7 emitted from the electron beam source 1. As the second electron optical system, there are provided an objective lens 2g in the first stage of the focusing system, an intermediate lens 2e for enlarging and projecting images formed on the focal plane of the objective lens 2g or diffraction images formed on the rear focal plane, and a projection lens 2f.

Signals detected with the detector 4a are sent through the CCD control section 4b to the image forming process section 21. The magnification changing section 6 is to change the magnification of the electron optical system 2 and sends, in this embodiment, magnification changing signals to the objective lens 2g, to the intermediate lens 2e, and to the projection lens 2f. The holder tilt control section 5b is used as the tilt control section 5 for controlling the tilt of the specimen holder 3. Incidentally, also in the transmission electron microscope, a component corresponding to the beam control section may be used as the tilt control section 5 for controlling the tilt of the specimen holder 3.

The raw images detected with the device constituted as described above, like those of the first embodiment, are also rectified for stereovision. Methods of correcting the deviation include one in which a reference template is used as shown in FIGS. 6 and 10 to determine rectifying parameters and to process images for stereovision, and the other in which reference marks of the specimen are used as shown in FIG. 11 to process images directly for stereovision.

The electron microscope of the above embodiment is described to be capable of providing stereovision both by deflecting the electron beam using the beam tilt control section and by tilting the specimen using the specimen holder tilt control section. However, this invention is not limited to the above but may be embodied as an electron microscope provided with either one of the beam tilt control section and the specimen holder tilt control section. While the above embodiment is described as one in which the data processing device 30 is connected through the operation control section 20 to the electron beam device 10, the present invention is not limited to the above but may be arranged that the data processing device 30 and the operation control section 20 are made into a single data processing device 30 and connected to the electron beam device 10.

5. Effect of the Invention

As described above, an electron beam device according to the present invention is made up of an electron beam source for emitting an electron beam, an electron optical system for irradiating the electron beam onto a specimen, a specimen holder for holding the specimen, a specimen tilting section for producing a relative tilt angle between the specimen holder and the electron beam, an electron beam detecting section for detecting the electron beam emitted from the specimen, and a data correcting section for correcting the three-dimensional detection data to have specified relationship under the condition of the relative tilt angle between the specimen holder and the electron beam. Therefore, it is possible to use the data correcting section to correct deviation of data of two sheets of images as detected in three dimensions so that the images may be orientated. So it is possible to measure the specimen in three dimensions and to form three-dimensional images of the specimen analogous to the data processing method of aerial triangulation.

A data processing device for an electron beam device according to this invention is connected to the electron beam device, and is made up of a measurement condition judging section for receiving measurement conditions of the electron beam device and a shape measuring section for receiving electron beam data detected with the electron beam detecting section at different relative tilt angles between the specimen holder and the incident electron beam irradiated from an electron beam source and for measuring three-dimensionally the shape of the specimen on the basis of the measurement conditions determined with the measurement condition judging section. Therefore, the shape of the specimen may be measured with the electron beam device in three dimensions under appropriate measurement conditions.

A method of manufacturing a reference template according to this invention uses an electron beam device made up of an electron beam source for emitting an electron beam, an electron optical system for irradiating the electron beam, a specimen holder for supporting a specimen, and an electron beam detecting section for detecting electron beams emitted from the specimen, and carried out through the steps of attaching to the specimen holder a reference template substrate to be a reference template, moving and irradiating the electron beam to the positions where reference marks are to be created on the reference template substrate, and creating the reference mark on the reference template substrate. Therefore, it is possible to provide a reference template having reference marks in very accurate positions where the reference marks should be formed and to obtain accurate rectifying parameters required to create rectified images for the stereovision of the specimen.

What is claimed is:

1. An electron beam device comprising:
   an electron beam source for emitting an electron beam;
   an electron optical system for directing said electron beam onto a specimen;
   a specimen holder for holding said specimen;
   a specimen tilting section for producing a relative tilt angle between said specimen holder and an incident electron beam;
   an electron beam detecting section for detecting electron beams emitted from said specimen; and
   a data correcting section for correcting three-dimensional detection data, which is based on the electron beams detected by the electron beam detecting section, to have a specified relationship under the condition of a relative tilt angle between said specimen holder and said electron beam;
   wherein said data correcting section comprises: a rectifying parameter acquiring means for acquiring rectifying parameters at relative tilt angles between said specimen holder and said incident electron beam, and lens distortion correcting parameters for correcting the lens distortion of said electron optical system.

2. An electron beam device according to claim 1, wherein said specimen tilting section is adapted to tilt said specimen relative to said incident electron beam.

3. An electron beam device according to claim 1, wherein said specimen tilting section is adapted to control said electron optical system so that said incident electron beam is irradiated onto said specimen at tilted angles.

4. An electron beam device according to claim 1, wherein said electron beam detecting section is adapted to detect secondary electrons emitted from said specimen.

5. An electron beam device according to claim 1, wherein said specimen has reference marks serving as reference positions; and
   said data correcting section uses said reference marks to correct deviation of said three-dimensional detection data into rectified data.

6. An electron beam device according to claim 1, wherein said rectifying parameter acquiring means acquires said rectifying parameters using reference marks on a reference template; and said data correcting section further comprises:

an image data rectifying means for correcting said three-dimensional detection data into rectified data using said rectifying parameters acquired.

7. An electron beam device according to claim 1 further comprising:

at least one of a shape measuring section for measuring the shape of said specimen on the basis of the data corrected with said data correcting section and a stereovision section for forming three-dimensional images of said specimen on the basis of the data corrected with said data correcting section.

8. A data processing device for an electron beam device, connected to said electron beam device, said electron beam device having an electron beam source for emitting an electron beam, an electron optical system irradiating said electron beam onto a specimen, a specimen holder for holding said specimen, a specimen tilting section for mutually tilting said specimen holder and said electron beam, and an electron beam detecting section for detecting electron beams emitted from said specimen, and a rectifying parameter acquiring means for acquiring rectifying parameters at relative tilt angles between said specimen holder and an incident electron beam, and lens distortion correcting parameters for correcting lens distortion of said electron optical system, said data processing device comprising: a data correcting section for receiving and correcting three-dimensional detection data, which is based on the electron beams detected by the electron beam detecting section, into data having a specified relationship with said rectifying parameters at relative tilt angles between said specimen holder and said incident electron beam, and lens distortion correcting parameters for correcting the lens distortion of said electron optical system.

9. A data processing device for an electron beam device according to claim 8, further comprising:

at least one of a shape measuring section for measuring the shape of said specimen on the basis of the data corrected with said data correcting section and a stereovision section for forming three-dimensional images of said specimen on the basis of the data corrected with said data correcting section.

10. A method of forming three-dimensional data of an electron beam device for measuring the shape of a specimen or for forming a three-dimensional image of said specimen using an electron beam device having an electron beam source for emitting an electron beam, an electron optical system for irradiating said electron beam onto a specimen, a specimen holder for holding said specimen, a specimen tilting section for tilting said specimen holder relative to an incident electron beam, and an electron beam detecting section for detecting electron beams emitted from said specimen, comprising:

said specimen being formed with reference marks serving as reference positions;

detecting first detection data with said electron beam detecting section in the state of a first relative tilt angle between said specimen holder and said incident electron beam;

detecting second detection data with said electron beam detecting section in the state of a second relative tilt angle between said specimen holder and said incident electron beam; and correcting said first and second detection data into rectified data with rectifying parameters at relative tilt angles between said specimen holder and said incident electron beam and lens distortion correcting parameters for correcting lens distortion of said electron optical system, based on said reference marks.

11. A method of forming three-dimensional data of an electron beam device for measuring the shape of a specimen or for forming a three-dimensional image of said specimen using said electron beam device having an electron beam source for emitting an electron beam, an electron optical system for irradiating said electron beam onto a specimen, a specimen holder for holding said specimen, a specimen tilting section for tilting said specimen holder relative to an incident electron beam, and an electron beam detecting section for detecting an electron beam emitted from said specimen, comprising:

in place of said specimen, inserting a reference template formed with reference marks serving as reference positions onto said specimen holder;

detecting first and second detection data related to said reference template with said electron beam detecting section under conditions of first and second relative tilt angles between said specimen holder and said incident electron beam;

acquiring rectifying parameters using said reference marks at relative tilt angles between said specimen holder and said incident electron beam;

inserting said specimen onto said specimen holder;

detecting first and second detection data related to said specimen with said electron beam detecting section under conditions of first and second relative tilt angles between said specimen holder and said incident electron beam; and correcting said first and second detection data into rectified data with rectifying parameters at relative tilt angles between said specimen holder and said incident electron beam and lens distortion correcting parameters for correcting lens distortion of said electron optical system.

12. A data processing device for an electron beam device, connected to said electron beam device, said electron beam device having an electron beam source for emitting an electron beam, an electron optical device irradiating said electron beam onto a specimen, a specimen holder for holding said specimen, a specimen tilting section for mutually tilting said specimen holder and said electron beam, and an electron beam detecting section for detecting electron beams emitted from said specimen; said data processing device comprising;

a measurement condition judging section for receiving conditions for measuring with said electron beam device;

a shape measuring section that receives data detected with said electron beam detecting section at different relative tilt angles caused with said specimen tilting section between said specimen holder and an incident electron beam, and measures the shape of said specimen in three dimensions on the basis of measurement conditions judged with said measurement condition judging section;

a rectifying parameter acquiring means that acquires rectifying parameters for correcting differences in distortion and in scale due to said tilt angles contained in the data detected at said different tilt angles using reference marks on a reference template and acquires lens distortion correcting parameters for correcting lens distortion of said electron optical device; and an image data rectifying means that corrects differences in distortion and in scale due to said tilt angles contained in the data detected at said different tilt angles using said acquired rectifying parameters and said lens distortion correcting parameters.

13. A data processing device for an electron beam device according to claim 12, wherein said measurement condition judging section judges measurement conditions using at least one of the information on the type of said electron beam device and the information on the magnification of said electron optical device.

14. A data processing device for an electron beam device according to claim 13, wherein said specimen has reference marks serving as reference positions; and said shape measuring section measures the shape of said specimen in three dimensions in the state of differences in distortion and in scale, due to said tilt angles and contained in detected data at said different tilt angles, corrected on the basis of reference marks contained in the data detected at said different tilt angles.

15. A data processing device for an electron beam device according to claim 12, wherein said specimen has reference marks serving as reference positions; and said shape measuring section measures the shape of said specimen in three dimensions in the state of differences in distortion and in scale, due to said tilt angles and contained in detected data at said different tilt angles, corrected on the basis of reference marks contained in the data detected at said different tilt angles.

16. A data processing device for an electron beam device according to claim 12, wherein said measuring section measures the shape of said specimen in three dimensions using the data detected at different tilt angles and corrected with said image data rectifying means.

17. A data processing device for an electron beam device according to claim 16, wherein the reference marks of said reference template are provided in relation to at least two types of height.

18. A method of measuring a specimen in three dimensions using an electron beam device having an electron beam source for emitting an electron beam, an electron optical system for directing said electron beam onto said specimen, a specimen holder for holding said specimen, a specimen tilting section for producing a relative tilt angle between said specimen holder and an incident electron beam, and an electron beam detecting section for detecting electron beams emitted from said specimen, comprising:

said specimen being formed with reference marks serving as reference positions;

detecting first detection data with said electron beam detecting section in the state of a first relative tilt angle between said specimen holder and said incident electron beam;

detecting second detection data with said electron beam detecting section in the state of a second relative tilt angle between said specimen holder and said incident electron beam;

correcting said first and second detection data into rectified data with rectifying parameters at relative tilt angles between said specimen holder and said incident electron beam, and lens distortion correcting parameters for correcting lens distortion of said electron optical system based on said rectifying parameters acquired; and measuring the shape of said specimen in three dimensions on the basis of the reference marks contained in said first and second detection data in the State of the differences, in distortion and scale due to differences in said first and second relative tilt angles and contained in said first and second detection data, and said corrected first and second detection data.

19. A method of measuring a specimen in three dimensions using an electron beam device having an electron beam source for emitting an electron beam, an electron optical system for directing said electron beam onto said specimen, a specimen holder for holding said specimen, a specimen tilting section for producing a relative tilt angle between said specimen holder and said incident electron beam, and an electron beam detecting section for detecting electron beam emitted from said specimen, comprising:

in place of said specimen, inserting a reference template formed with reference marks serving as reference positions onto said specimen holder;

detecting first and second detection data related to said reference template with said electron beam detecting section under conditions of first and second relative tilt angles between said specimen holder and said incident electron beam;

acquiring, using said reference marks, rectifying parameters for correcting the differences in distortion and in scale, due to differences in said first and second relative tilt angles and contained in said first and second detection data;

inserting said specimen onto said specimen holder;

detecting first and second detection data related to said specimen with said electron beam detecting section under conditions of first and second relative tilt angles between said specimen holder and said incident electron beam; and

* * * * *